US012787388B2

(12) United States Patent
Bao et al.

(10) Patent No.: US 12,787,388 B2
(45) Date of Patent: Nov. 3, 2026

(54) VERTICAL CHANNEL FIELD EFFECT TRANSISTOR (VCFET) WITH REDUCED CONTACT RESISTANCE AND/OR PARASITIC CAPACITANCE, AND RELATED FABRICATION METHODS

(71) Applicant: QUALCOMM Incorporated, San Diego, CA (US)

(72) Inventors: Junjing Bao, San Diego, CA (US); Xia Li, San Diego, CA (US); Giridhar Nallapati, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 944 days.

(21) Appl. No.: 17/933,568

(22) Filed: Sep. 20, 2022

(65) Prior Publication Data

US 2024/0096964 A1 Mar. 21, 2024

(51) Int. Cl.
*H10D 30/63* (2025.01)
*H10D 30/01* (2025.01)
(Continued)

(52) U.S. Cl.
CPC ......... *H10D 62/292* (2025.01); *H10D 30/025* (2025.01); *H10D 30/63* (2025.01);
(Continued)

(58) Field of Classification Search
CPC .... H10D 30/025; H10D 30/63; H10D 30/635; H10D 64/252; H10D 64/2523; H10D 64/2527
See application file for complete search history.

(56) References Cited

U.S. PATENT DOCUMENTS 9,368,572 B1 * 6/2016 Cheng .................. H10D 30/031
9,799,749 B1 10/2017 Bi et al.
(Continued)

FOREIGN PATENT DOCUMENTS

WO 2010010865 A1 1/2010

OTHER PUBLICATIONS

International Search Report and Written Opinion for International Patent Application No. PCT/US2023/074070, mailed Apr. 19, 2024, 22 pages.
(Continued)

*Primary Examiner* — Matthew C Landau
*Assistant Examiner* — Vincent Kipkemoi Rono
(74) *Attorney, Agent, or Firm* — W&T

(57) ABSTRACT

Vertical channel field-effect transistors (VCFETs) with reduced contact resistance and/or parasitic capacitance, and related fabrication methods. In exemplary aspects, to reduce contact resistance of the VCFET, an end portion of the vertical channel has a semiconductor structure that has an expanded width in the horizontal direction parallel to the substrate surface. This provides a greater area to form a contact for a source/drain to reduce contact resistance of the VCFET. To reduce the parasitic capacitance between the gate and a contact of the VCFET, the spacer includes one or more air gaps that form an air spacer(s) between the gate and the contact to reduce the overall average permittivity of the spacer. In one example, the air spacer(s) of the VCFET is elongated in the horizontal direction parallel to the substrate surface (and perpendicular to the vertical direction of the vertical channel) to further reduce the parasitic capacitance.

26 Claims, 14 Drawing Sheets

(51) Int. Cl.

| | |
|---|---|
| ***H10D 30/69*** | (2025.01) |
| ***H10D 62/13*** | (2025.01) |
| ***H10D 62/17*** | (2025.01) |
| ***H10D 62/822*** | (2025.01) |
| ***H10D 64/01*** | (2025.01) |
| ***H10D 64/23*** | (2025.01) |
| ***H10D 64/66*** | (2025.01) |
| ***H10D 84/85*** | (2025.01) |

(52) U.S. Cl.
CPC ......... *H10D 30/797* (2025.01); *H10D 62/151* (2025.01); *H10D 62/822* (2025.01); *H10D 64/01* (2025.01); *H10D 64/252* (2025.01); *H10D 64/679* (2025.01); *H10D 84/85* (2025.01)

(56) References Cited

U.S. PATENT DOCUMENTS

| | | | | |
|---|---|---|---|---|
| 9,847,416 | B1 | 12/2017 | Nowak et al. | |
| 10,395,988 | B1 | 8/2019 | Cheng et al. | |
| 2007/0148939 | A1* | 6/2007 | Chu | H10D 30/47 257/E29.085 |
| 2009/0090934 | A1* | 4/2009 | Tezuka | H10D 62/121 257/190 |
| 2018/0006024 | A1 | 1/2018 | Anderson et al. | |
| 2018/0053821 | A1 | 2/2018 | Mallela et al. | |
| 2018/0240716 | A1 | 8/2018 | Cheng et al. | |
| 2018/0358452 | A1* | 12/2018 | Qi | H10D 30/025 |
| 2020/0161303 | A1 | 5/2020 | Bi et al. | |
| 2020/0251558 | A1 | 8/2020 | Hashemi et al. | |
| 2020/0303497 | A1* | 9/2020 | Yeh | H10D 30/025 |
| 2020/0343222 | A1 | 10/2020 | Wu et al. | |
| 2020/0365469 | A1 | 11/2020 | Yamashita et al. | |
| 2021/0280684 | A1* | 9/2021 | Lu | H10D 30/014 |
| 2023/0066230 | A1* | 3/2023 | Peng | H10D 30/014 |
| 2023/0178651 | A1 | 6/2023 | Zhang et al. | |
| 2024/0072051 | A1 | 2/2024 | Anderson et al. | |

OTHER PUBLICATIONS

Invitation to Pay Additional Fees and Partial International Search Report for International Patent Application No. PCT/ US2023/ 074070, mailed Jan. 19, 2024, 11 pages.

Jagannathan, H. et al., "Vertical-Transport Nanosheet Technology for CMOS Scaling beyond Lateral-Transport Devices," 2021 IEEE International Electron Devices Meeting (IEDM), Dec. 11, 2016, 2021, San Francisco, CA, USA, IEEE, 4 pages.

U.S. Appl. No. 18/047,954, filed Sep. 20, 2022.

* cited by examiner

VERTICAL CHANNEL FIELD EFFECT TRANSISTOR (VCFET) WITH REDUCED CONTACT RESISTANCE AND/OR PARASITIC CAPACITANCE, AND RELATED FABRICATION METHODS

BACKGROUND

I. Field of the Disclosure

The field of the disclosure relates to semiconductor devices forming integrated circuits (ICs), and more specifically, to gate around transistors, such as Fin Field-Effect Transistors (FETs) (FinFETs) and gate-all-around (GAA) transistors.

II. Background

Transistors are essential components in modern electronic devices. Large numbers of transistors are employed in integrated circuits (ICs) in many modern electronic devices. For example, components such as central processing units (CPUs), graphics processing units (GPUs), and memory systems each employ a large quantity of transistors for logic circuits and memory devices.

As electronic devices become more complex in functionality, so does the need to include a greater number of transistors in such devices. But as electronic devices are required to be provided in increasingly smaller packages, such as in mobile devices for example, there is a need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) with smaller parasitic capacitances, resulting in reduced circuit delay. However, as channel length in planar transistors is reduced such that the channel length is of the same order of magnitude as the depletion layers widths, short channel effects (SCEs) can occur that degrade performance. More specifically, SCEs in planar transistors can cause increased current leakage, reduced threshold voltage, and/or threshold voltage roll-off (i.e., reduced threshold voltage at shorter gate lengths).

SUMMARY OF THE DISCLOSURE

Aspects disclosed herein include vertical channel (VC) field-effect transistors (FETs) (VCFETs) with reduced contact resistance and/or parasitic capacitance. Related fabrication methods are also disclosed. In exemplary aspects, VCFET is a FET that includes a semiconductor channel ("channel") that has a height extending along a longitudinal axis in a first, horizontal direction orthogonal to a substrate surface of the substrate. The VCFET is disposed on or adjacent to the substrate. The VCFET also includes a source and a drain (e.g., an epitaxial source layer and epitaxial drain layer) that are each disposed in contact with respective end surfaces of the vertical channel. The vertical channel of the VCFET is configured to transport charge in a vertical direction orthogonal to the substrate along the height of the vertical channel between the source and the drain in response to an electric field created by energy applied to a gate (e.g., a Fin field-effect transistor (FET) (FinFET) gate, an all-around gate) disposed adjacent to the vertical channel. The VCFET supports the ability to provide a longer channel length in a vertical direction to conserve area for the VCFET in the horizontal direction on the substrate. The vertical channel of the VCFET also supports the ability to dispose more gate material of the gate adjacent and/or surrounding the vertical channel to support better electrostatic control and higher current. However, the vertical channel being elongated in the vertical direction also reduces the area in which a source/drain contact can be formed (e.g., by epitaxial growth) thereby increasing the parasitic contact resistance of the VCFET. Further in exemplary aspects, to reduce contact resistance of the VCFET, an end portion of the vertical channel has a semiconductor structure that has an expanded width in the horizontal direction parallel to the substrate surface. This provides a greater area in which to form a contact for a source/drain to reduce contact resistance of the vertical VCFET.

Also, in other exemplary aspects, the VCFET includes a spacer that includes a dielectric material to isolate a second drain/source contact from the gate. A parasitic capacitance exists between the gate and the contact when an energy is applied to the gate of the VCFET to create an electric field in the vertical channel. In one example, the enlargement of the end portion of the vertical channel reduces the dielectric material of the spacer, thus contributing to a higher parasitic capacitance between the gate and the contact. Thus, in other exemplary aspects, to reduce the parasitic capacitance of the VCFET, the spacer includes one or more air gaps that form an air spacer(s) between the gate and the contact to reduce the overall average permittivity of the spacer. The permittivity of air is less than the permittivity of the dielectric material of the spacer(s). Reducing the permittivity of the spacer between the gate and the contact reduces the parasitic capacitance of the VCFET. In one example, the air spacer(s) of the VCFET is elongated in the horizontal direction parallel to the substrate surface (and perpendicular to the vertical direction of the vertical channel) to further reduce the parasitic capacitance. This is because the horizontal air spacer(s) has the effect of contributing series capacitance to the parasitic capacitance between the gate and the contact because of the orientation of the air gap(s) with respect to the electric field created between gate and the contact. Added series capacitance to the parasitic capacitance between the gate and the contact reduces the parasitic capacitance between the gate and the contact and thus the overall parasitic capacitance of the VCFET.

In this regard, in one exemplary aspect, a VCFET is provided. The VCFET comprises a substrate comprising a substrate surface. The VCFET also comprises a channel. The channel comprises a first channel portion comprising a first end surface and a second end surface opposite the first end surface. The second end surface having a first width in a first direction parallel to the substrate surface. The channel also comprises a second channel portion comprising a third end surface coupled to the second end surface and a fourth end surface opposite the third end surface. The fourth end surface having a second width in the first direction greater than the first width. The VCFET also comprises a gate adjacent to the first channel portion. The VCFET also comprises a source/drain coupled to the first end surface of the first channel portion. The VCFET also comprises a drain/source coupled to the fourth end surface of the second channel portion.

In another exemplary aspect, a method of fabricating a VCFET is provided. The method comprises providing a substrate comprising a substrate surface. The method also comprises forming a channel, comprising forming a first channel portion comprising a first end surface and a second end surface opposite the first end surface, wherein the second end surface having a first width in a first direction parallel to the substrate surface. Forming the channel also comprises forming a second channel portion comprising a third end surface coupled to the second end surface and a fourth end surface opposite the third end surface, wherein the fourth end surface having a second width in the first direction greater than the first width. The method also comprises forming a gate adjacent to the first channel portion. The method also comprises forming a source/drain coupled to the first end surface of the first channel portion. The method also comprises forming a drain/source coupled to the fourth end surface of the second channel portion.

In another exemplary aspect, an integrated circuit (IC) is provided. The IC comprises a substrate comprising a substrate surface. The IC also comprises a plurality of field-effect transistors (FETs) on the substrate surface. The plurality of FETs, comprises a P-semiconductor type (P-type) FET comprising a P-type channel, comprising a first P-type channel portion comprising a first end surface and a second end surface opposite the first end surface, wherein the second end surface having a first width in a first direction parallel to the substrate surface; and a second P-type channel portion comprising a third end surface coupled to the second end surface and a fourth end surface opposite the third end surface, wherein the fourth end surface having a second width in the first direction greater than the first width. The P-type FET also comprises a first gate adjacent to the first P-type channel portion. The P-type FET also comprises a P-type source/drain coupled to the first end surface of the first P-type channel portion. The P-type FET also comprises a P-type drain/source coupled to the fourth end surface of the second P-type channel portion. The plurality of FETs also comprises an N-semiconductor type (N-type) FET, comprising a N-type channel comprising a first N-type channel portion comprising a fifth end surface and a sixth end surface opposite the fifth end surface, wherein the sixth end surface having a third width in the first direction parallel to the substrate surface; and a second N-type channel portion comprising a seventh end surface coupled to the sixth end surface and an eighth end surface opposite the seventh end surface, wherein the eighth end surface having a fourth width in the first direction greater than the third width. The N-type FET also comprises a second gate adjacent to the first N-type channel portion. The N-type FET also comprises an N-type source/drain coupled to the fifth end surface of the first N-type channel portion. The N-type FET also comprises an N-type drain/source coupled to the eighth end surface of the second N-type channel portion.

BRIEF DESCRIPTION OF THE FIGURES

FIG. 9 is a block diagram of an exemplary electronic device in the form of a processor-based system that can include an IC that includes a VCFET(s) that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, including but not limited to the VCFETs in FIGS. 2A-3, and fabricated according to a fabrication process, including but not limited to the exemplary fabrication processes in FIGS. 5-6G.

DETAILED DESCRIPTION

Figure 1:
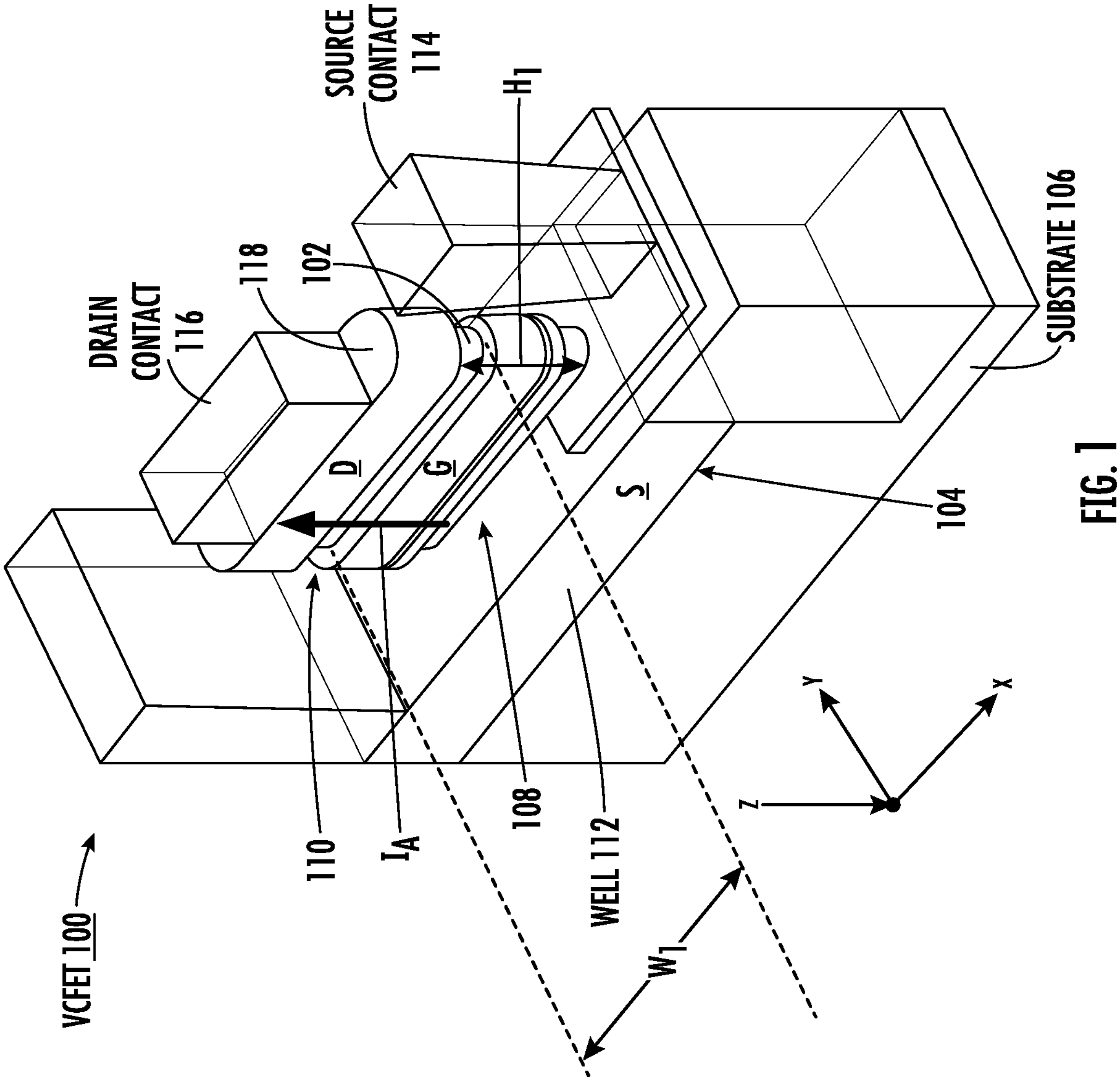
FIG. 1 is a top, perspective view of an exemplary vertical channel field-effect transistor (VCFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include vertical channel (VC) field-effect transistors (FETs) (VCFETs) with reduced contact resistance and/or parasitic capacitance. Related fabrication methods are also disclosed. In exemplary aspects, VCFET is a FET that includes a semiconductor channel ("channel") that has a height extending along a longitudinal axis in a first, horizontal direction orthogonal to a substrate surface of the substrate. The VCFET is disposed on or adjacent to the substrate. The VCFET also includes a source and a drain (e.g., an epitaxial source layer and epitaxial drain layer) that are each disposed in contact with respective end surfaces of the vertical channel. The vertical channel of the VCFET is configured to transport charge in a vertical direction orthogonal to the substrate along the height of the vertical channel between the source and the drain in response to an electric field created by energy applied to a gate (e.g., a Fin field-effect transistor (FET) (FinFET) gate, an all-around gate) disposed adjacent to the vertical channel. The VCFET supports the ability to provide a longer channel length in a vertical direction to conserve area for the VCFET in the horizontal direction on the substrate. The vertical channel of the VCFET also supports the ability to dispose more gate material of the gate adjacent and/or surrounding the vertical channel to support better electrostatic control and higher current. However, the vertical channel being elongated in the vertical direction also reduces the area in which a source/drain contact can be formed (e.g., by epitaxial growth) thereby increasing the parasitic contact resistance of the VCFET. Further in exemplary aspects, to reduce contact resistance of the VCFET, an end portion of the vertical channel has a semiconductor structure that has an expanded width in the horizontal direction parallel to the substrate surface. This provides a greater area in which to form a contact for a source/drain to reduce contact resistance of the vertical VCFET.

Also, in other exemplary aspects, the VCFET includes a spacer that includes a dielectric material to isolate a second drain/source contact from the gate. A parasitic capacitance exists between the gate and the contact when an energy is applied to the gate of the VCFET to create an electric field in the vertical channel. In one example, the enlargement of the end portion of the vertical channel reduces the dielectric material of the spacer, thus contributing to a higher parasitic capacitance between the gate and the contact. Thus, in other exemplary aspects, to reduce the parasitic capacitance of the VCFET, the spacer includes one or more air gaps that form an air spacer(s) between the gate and the contact to reduce the overall average permittivity of the spacer. The permittivity of air is less than the permittivity of the dielectric material of the spacer(s). Reducing the permittivity of the spacer between the gate and the contact reduces the parasitic capacitance of the VCFET. In one example, the air spacer(s) of the VCFET is elongated in the horizontal direction parallel to the substrate surface (and perpendicular to the vertical direction of the vertical channel) to further reduce the parasitic capacitance. This is because the horizontal air spacer(s) has the effect of contributing series capacitance to the parasitic capacitance between the gate and the contact because of the orientation of the air gap(s) with respect to the electric field created between gate and the contact. Added series capacitance to the parasitic capacitance between the gate and the contact reduces the parasitic capacitance between the gate and the contact and thus the overall parasitic capacitance of the VCFET.

Examples of VCFETs that include an expanded vertical channel to reduce contact resistance, and/or a spacer that includes one or more horizontal air gaps to reduce the parasitic capacitance start at FIG. 2A discussed below. Before discussing these examples, an exemplary VCFET 100 is first described with regard to FIG. 1.

In this regard, FIG. 1 is a top, perspective view of an exemplary VCFET 100. As shown in FIG. 1, the VCFET 100 includes a vertical channel 102 that is elongated and has height $H_1$ in the vertical direction (Z-axis direction). The height $H_1$ is in the vertical direction (Z-axis direction) orthogonal to a substrate surface 104 of a substrate 106 in which the VCFET 100 is formed. The vertical channel also has a channel width $W_1$ in the horizontal direction (X-axis direction) parallel to the substrate surface 104 of the substrate 106. A source structure ("source") S and drain structure ("drain") D are disposed on opposite ends of the vertical channel 102. The vertical channel 102 is a semiconductor material that is configured to transport current in response to an electric field being formed in the vertical channel 102. In this example, the source S is disposed on a first, bottom end 108 of the vertical channel 102 in the vertical direction (Z-axis direction). The drain D is disposed on a second, top end 110 of the vertical channel 102 in the vertical direction (Z-axis direction) that is opposite of the first, bottom end 108. The source S and the drain D are made from semiconductor materials, and may be formed as epitaxial layers on the respective first, and second ends 108, 110 of the vertical channel 102. For example, the source S and the drain D may be epitaxial layers that are of an N-type semiconductor for an N-type (N) metal oxide semiconductor (MOS) (NMOS) device, and a P-type semiconductor material for a P-type (P) PMOS device. The source S is disposed in a well 112, which is a P-well for an NMOS device, and N-well for an PMOS device.

With continuing reference to FIG. 1, a gate structure ("gate") G is disposed around the vertical channel 102 of the VCFET 100 between the drain D and the source S. In this manner, a voltage potential between the gate G and the source S creates an electric field in the vertical channel 102 that causes the vertical channel 102 to conduct current IA in the vertical channel 102 between the source S and the drain D. The channel height $H_1$ of the vertical channel 102 defines the effective gate length $L_{eff}$ of the gate G. This structure of the VCFET 100 that includes a vertical channel 102 elongated in the vertical direction (Z-axis direction) for its effective channel length to extend in the vertical direction (Z-axis direction) has an advantage of conserving area in the horizontal directions (X- and Y-axes directions) on the substrate 106. In a conventional planar FET design, the channel would extend in the horizontal direction parallel to the substrate surface 104 of the substrate 106, thus consuming additional area in the substrate 106 in the horizontal directions (X- and Y-axes directions). The channel height $H_1$ and the $L_{eff}$ may be defined layer-by-layer using an epitaxial process. This is more accurate than the photolithographic process used to define the same distance in a FinFET structure for example. This source S and drain D being formed of epitaxial layers may further provide stress and strain into the vertical channel 102 to increase current mobility in the vertical channel 102. In an NMOS device, tensile stress can be introduced to the vertical channel 102 to increase current mobility, while for a PMOS device, compressive stress can be introduced to the vertical channel 102 to increase current mobility.

With continuing reference to FIG. 1, source and drain contacts 114, 116 made from a metal material, such as copper, are coupled to the respective source S and drain D to provide metal contacts for providing conductive contacts to the source S and the drain D of the VCFET 100. Because the vertical channel 102 obstructs direct access to the source S at the first, bottom end 108 of the vertical channel 102, in this example, the source contact 114 is also elongated in the vertical direction (Z-axis direction) and displaced a distance from the vertical channel 102 in the horizontal direction (Y-axis direction). The drain contact 116 is disposed above the drain D on a top surface 118 of the drain D in the vertical direction (Z-axis direction) since the vertical channel 102 does not obstruct access to the drain D. Because the drain D is formed on the second, top end 110 of the vertical channel 102 in a vertical direction (Z-axis direction), the surface area defined in part by the channel width $W_1$ of the second, top end 110 of the vertical channel 102 will control the available surface in which the drain D can be disposed or formed. Thus, the drain D size is limited by the channel width $W_1$ of the vertical channel 102 in the VCFET 100. And in turn, the size of the drain contact 116 is limited by the size of the drain D. Thus, the channel width $W_1$ of the vertical channel 102 being limited can result in a larger contact resistance between the drain contact 116 and the drain D than otherwise desired, thus resulting in a larger contact resistance in the VCFET 100.

In an example, to address the desire to provide a VCFET with a reduced contact resistance, side views of an exemplary VCFET 200 are shown in FIGS. 2A-2D that includes a vertical channel 202 with a second channel portion 204(2) expanded in width in a horizontal direction (X- and/or Y-axes direction). The second channel portion 204(2) is a semiconductor structure that is a portion of the overall vertical channel 202. The second channel portion 204(2) is expanded in width $W_2$ in a horizontal direction (X-axis direction) perpendicular to a height $H_2$ of the vertical channel 202 in the vertical direction (Z-axis direction) to reduce contact resistance of the VCFET 200. The height $H_2$ of the vertical channel 202 is in the vertical direction (Z-axis direction) orthogonal to a substrate surface 205 of a substrate 206 in which the VCFET 200 is formed. For example, the substrate surface 205 could be a semiconductor material, such as silicon. In this example, the vertical channel 202 is comprised of a first channel portion 204(1) and the second channel portion 204(2). The first channel portion 204(1) is a semiconductor structure that is a portion of the overall vertical channel 202. Both the first and second channel portions 204(1), 204(2) are of a semiconductor material that is configured to allow current to flow therethrough when subjected to an electric field. The first channel portion 204(1) has a first end surface 208(1) and a second end surface 208(2) opposite the first end surface 208(1) in the vertical direction (Z-axis direction). The first channel portion 204(1) has a height $H_3$ in the vertical direction (Z-axis direction) that is in a direction orthogonal to the substrate surface 205 of the substrate 206. The first channel portion 204(1) is elongated in the vertical direction (Z-axis direction) such that its width $W_3$ in the horizontal direction (X-axis direction) (and parallel to the substrate surface 205) is less than its height $H_3$ in the vertical direction (Z-axis direction). Thus, the first channel portion 204(1) of the vertical channel 202 is configured to transport current in the vertical direction (Z-axis direction).

Figure 2A:
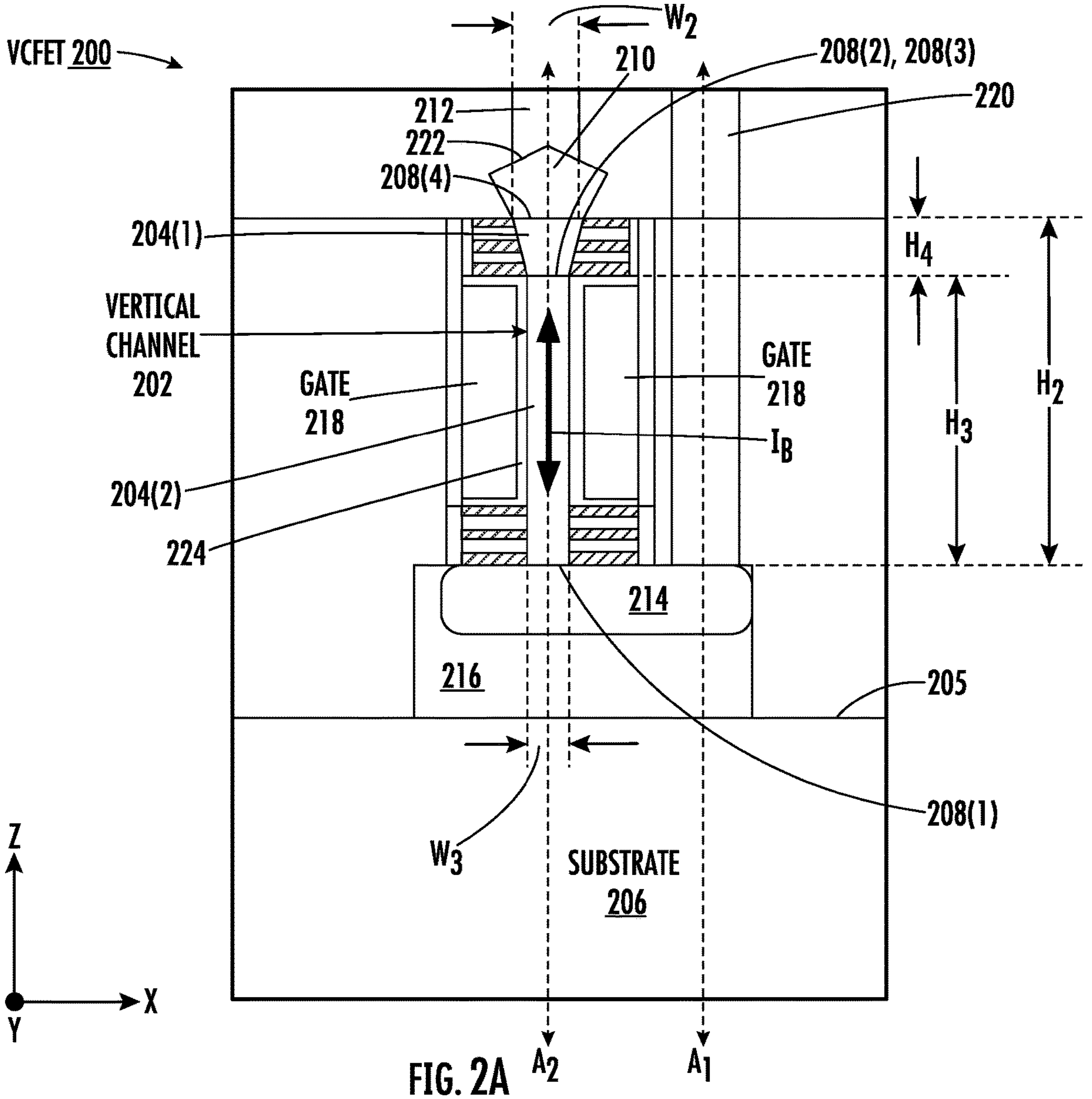
FIGS. 2A-2D are side views of an exemplary VCFET that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET.
Figure 3:
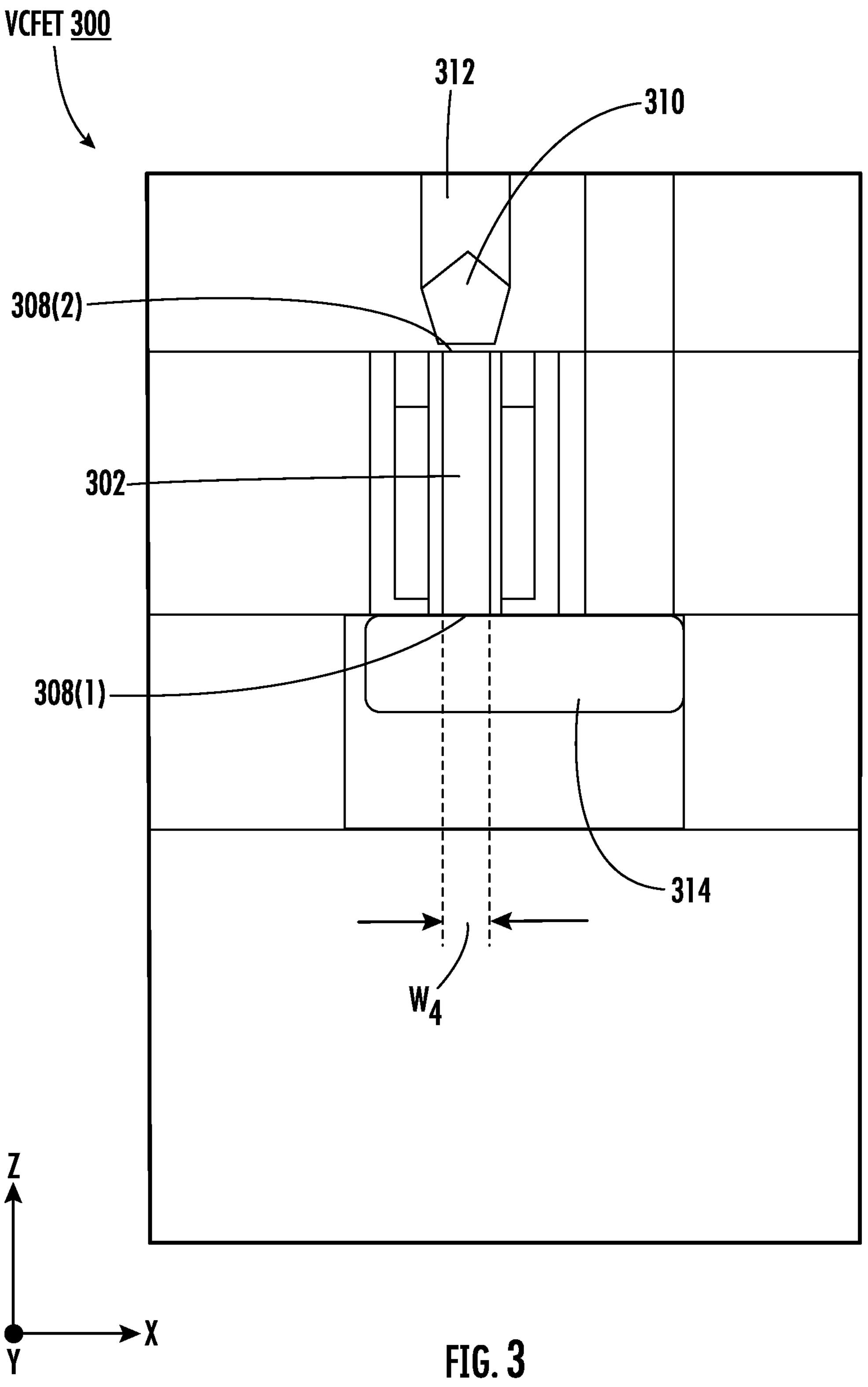
FIG. 3 is a side view of exemplary integrated circuit (IC) that includes a N-semiconductor type (N-type) VCFET and a P-semiconductor type (P-type) VCFET disposed on a substrate and that can be used in a complementary metal oxide semiconductor (CMOS) circuit.

With continuing reference to FIG. 2A, the vertical channel 202 also has its second channel portion 204(2) that has a third end surface 208(3) and a fourth end surface 208(4) opposite the third end surface 208(3) in the vertical direction (Z-axis direction). In this example, the third end surface 208(3) of the second channel portion 204(2) is coupled to the second end surface 208(2) of the first channel portion 204(1) so that the first and second channel portions 204(1), 204(2) form a contiguous channel structure for the vertical channel 202. The second channel portion 204(2) has a height $H_4$ in the vertical direction (Z-axis direction) that is in a direction orthogonal to the substrate surface 205 of the substrate 206. Thus, the height $H_3$ of the first channel portion 204(1) and the height $H_4$ of the second channel portion 204(2) of the vertical channel 202 contribute to the overall height $H_2$, and thus the effective channel length, of the vertical channel 202. As discussed above, at least a portion of the second channel portion 204(2) has width that is greater than the width $W_3$ of the first channel portion 204(1) in the horizontal direction (X-axis direction). In this example, the fourth end surface 208(4) of the second channel portion 204(2) has a width $W_2$ that is larger than the width $W_3$ of the first channel portion 204(1). Because a drain 210 is formed on the fourth end surface 208(4) of the second channel portion 204(2) of the vertical channel 202 in a vertical direction (Z-axis direction), the surface area defined in part by the channel width $W_2$ fourth end surface 204(4) of the second channel portion 204(2) will control the available surface in which the drain 210 can be disposed or formed. In this manner, the fourth end surface 208(4) of the second channel portion 204(2) can be of a larger surface area than the second end surface 208(2) of the first channel portion 204(1), so that in this example, a larger sized drain 210 can be formed in contact with the vertical channel 202. This has the effect of reducing the contact resistance between a drain contact 212 coupled to the drain 210, and the drain 210, which in effect reduces the contact resistance of the VCFET 200 over a design in which the drain 210 would be formed in contact with the second end surface 208(2) of the first channel portion 204(1) of the vertical channel 202. This is in contrast to, for example, the VCFET 300 in FIG. 3. In the VCFET 300 in FIG. 3, a source 314 is disposed on a first end surface 308(1) of a vertical channel 302, and a drain 310 is disposed on a second end surface 308(2) of the vertical channel 302. A drain contact 312 is formed in contact with the drain 310. The vertical channel 302 only has one channel portion that has a constant width $W_4$ such that the vertical channel 302 does not have a channel portion with an enlarged width for forming the drain 310. Thus, the drain 310 being formed in contact with the vertical channel 302 may be limited in size based on the constant width $W_4$ of the vertical channel 302.

With reference back to the VCFET 200 in FIG. 2A, as an example, the width $W_2$ of the second channel portion 204(2) of the vertical channel 202 may be between one (1) nanometer (nm) twenty (20) nm. The width $W_3$ of the first channel portion 204(1) of the vertical channel 202 may be between one (1) nm and 10 nm as an example. A ratio of the width $W_2$ of the second channel portion 204(2) of the vertical channel 202 to the width $W_3$ of the first channel portion 204(1) of the vertical channel 202 may be at least 1.1 as an example. The difference in width between the width $W_2$ of the second channel portion 204(2) and the width $W_3$ of the first channel portion 204(1) can be selected based on the desired performance criteria of the VCFET 200. For example, if lower contact resistance is desired, the width $W_2$ of the second channel portion 204(2) can be enlarged to enlarge the surface area of the fourth end surface 208(4) and the volume of the second channel portion 204(2). An increase in width $W_2$ of the second channel portion 204(2) may require an enlargement of the width $W_3$ of the first channel portion 204(1) based on the fabrication methods used, since the third end surface 208(3) of the second channel portion 204(2) is coupled to the second end surface 208(2) of the first channel portion 204(1) to form the vertical channel 202.

With continuing reference to FIG. 2A, the VCFET 200 includes a source structure ("source") 214 and the drain 210 disposed on opposite ends of the vertical channel 202 adjacent to or in contact with the respective first and fourth end surfaces 208(1), 208(4) of the respective first and second channel portions 204(1), 204(2). In this example, the source 214 is disposed adjacent to the first end surface 208(1) of the first channel portion 204(1) of the vertical channel 202 in the vertical direction (Z-axis direction). The drain D is adjacent to the fourth end surface 208(4) of the second channel portion 204(2) of the vertical channel 202 in the vertical direction (Z-axis direction) that is opposite of the first end surface 208(1). The source S and the drain D are made from semiconductor materials, and may be formed as epitaxial layers on the respective first and fourth end surfaces 208(1), 208(2) of the vertical channel 202. For example, the source S and the drain may be epitaxial layers that are of an N-type semiconductor for an N-type (N) metal oxide semiconductor (MOS) (NMOS) device, and a P-type semiconductor material for a P-type (P) PMOS device. The source 214 is disposed in a well 216, which is a P-well for an NMOS device, and N-well for an PMOS device. The source 214 and the drain 210 may be silicon (Si) or silicon germanium (SiGe) as non-limiting examples.

The substrate 206 of the VCFET 200 may be a <100> silicon substrate as an example. If the VCFET 200 is provided as a PMOS device/transistor, the vertical channel 202 of the VCFET 200 may be oriented in the <011> plane relative to the substrate surface 205. If the VCFET 200 is provided as an NMOS device/transistor, the vertical channel 202 of the VCFET 200 may be oriented in the <001> plane relative to the substrate surface 205. This configuration of orientations between the substrate 206 and the VCFET 200 provides for optimized charge mobility in the vertical channel 202. Used in this context, <100> is an indication of the crystal plane of the silicon substrate surface 205 surface using Miller indices. These indices are used to indicate the orientation of silicon crystalline structure atoms. The orientation results from the growth direction used for the silicon ingot from which a silicon wafer was sliced. As such, in the example provided, a silicon has been fabricated to present a <100> orientation surface onto which additional structures may be fabricated. An N-type VCFET 200 can be fabricated in the <−001> plane perpendicular to a <100> silicon substrate surface 205, while a P-type VCFET 200 can be fabricated 45 degrees in the <011> plane perpendicular to a <100> silicon substrate surface 205.

With continuing reference to FIG. 2A, a gate structure ("gate") 218 is disposed around the vertical channel 202 of the VCFET 200 between the drain D and the source S in the vertical direction (Z-axis direction). For example, the gate 218 may completing surround the vertical channel 202 in the X- and Y-axis directions such that the VCFET 200 is a gate-all-around (GAA) device. For example, the vertical channel 200 may have a width in the X-axis direction of one (1) to ten (10) nm, and a depth in the Y-axis direction of ten (10) to fifty (50) nm. The gate 218 is a metal layer or structure that can conduct current. In this manner, a voltage potential between the gate 218 and the source 214 creates an electric field in the vertical channel 202 that causes the vertical channel 202 to conduct current $I_B$ in the vertical channel 202 between the source 214 and the drain 210. The channel height $H_2$ of the vertical channel 202 defines the effective gate length $L_{eff.}$ of the gate 218. This structure of the VCFET 200 with the elongated vertical channel 202 in the vertical direction (Z-axis direction) for its effective channel length to extend in the vertical direction (Z-axis direction) has an advantage of conserving area in the horizontal directions (X- and Y-axes directions) on the substrate 206. The channel height $H_1$ and the effective length $L_{eff}$ of the gate 218 may be defined layer-by-layer using an epitaxial process. This may be more accurate than the photolithographic process used to define the same distance in a FinFET structure for example. This source 214 and drain 210 being formed of epitaxial layers may further provide stress and strain into the vertical channel 202 to increase current mobility in the vertical channel 202. In an NMOS device, tensile stress can be introduced to the vertical channel 202 to increase current mobility, while for a PMOS device, compressive stress can be introduced to the vertical channel 202 to increase current mobility.

With continuing reference to FIG. 2A, a source contact 220 and the drain contact 212 made from a metal material, such as copper, are coupled to the respective source 214 and drain 210 of the VCFET 200. The source and drain contacts 220, 212 provide metal contacts for providing conductive contacts to the respective source 214 and the drain 210. Because the vertical channel 202 obstructs direct access to the source 214, in this example, the source contact 220 is also elongated in the vertical direction (Z-axis direction) along a first longitudinal axis $A_1$ and displaced a distance from the vertical channel 202 in the horizontal direction (Y-axis direction). The drain contact 212 is disposed above the drain D on a top surface 222 of the drain 210 since the second channel portion 204(2) of the vertical channel 202 does not obstruct access to the drain 210. The drain contact 212 is elongated in the vertical direction (Z-axis direction) along a second longitudinal axis A2 parallel to the first longitudinal axis $A_1$. The gate 218 is disposed adjacent to the first channel portion 204(1) of the vertical channel 202. In this example, the gate 218 is an "all-around" structure that is disposed completely around an entire sidewall 224 of the first channel portion 204(1). The crystal structure for the channel sidewall of the vertical channel 202 of a N-type VCFET 200 can oriented in the <001> plane relative to the substrate surface 205. The crystal structure for the channel sidewall of the vertical channel 202 of a P-type VCFET 200 can oriented in the <011> plane relative to the substrate surface 205.

Figures 2B, 2C, 2D:
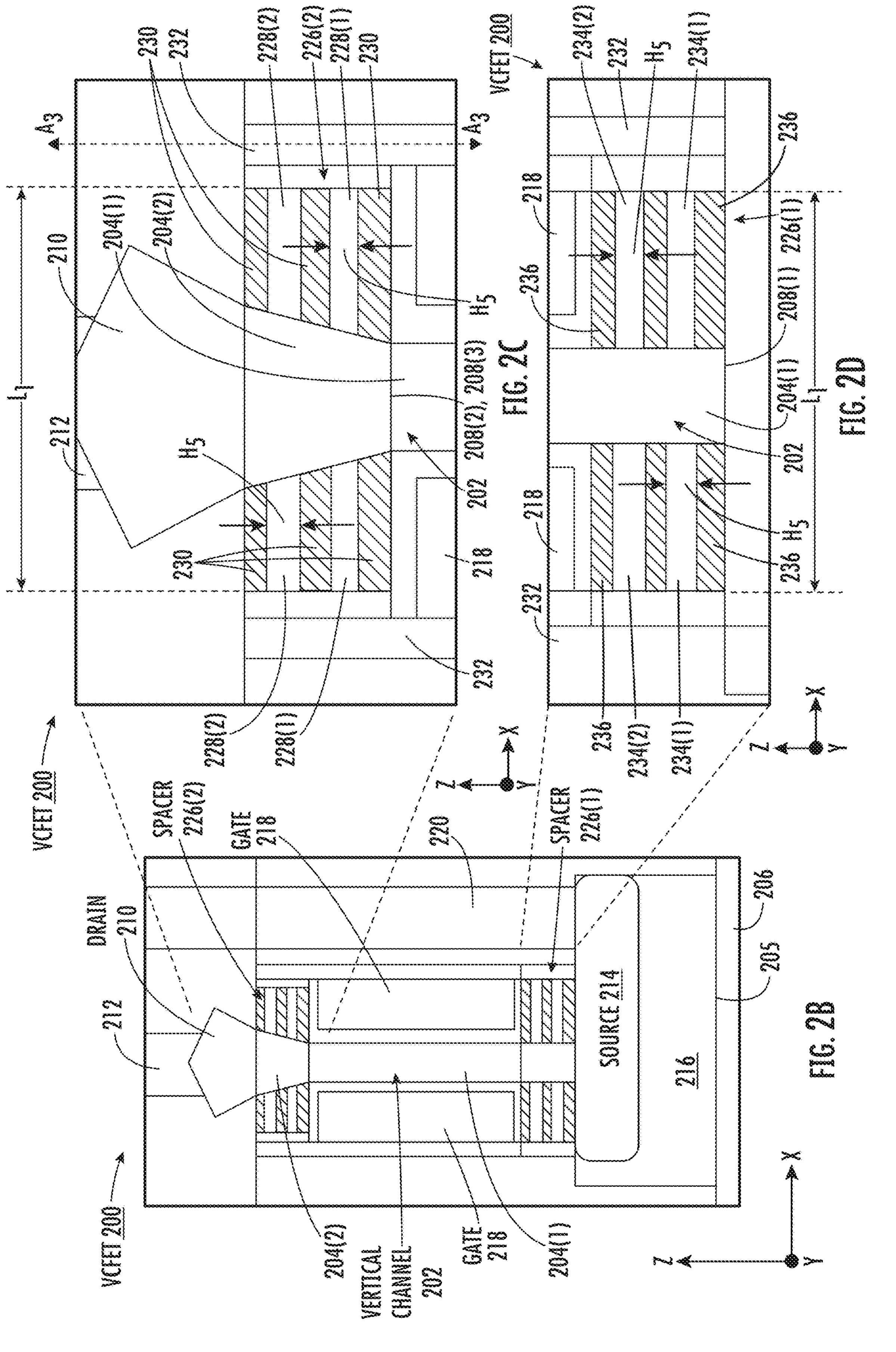

The VCFET 200 in FIG. 2A also includes a first, bottom spacer 226(1) and a second, top spacer 226(2) between the gate 218 and the source contact 220 in this example. The first, bottom spacer 226(1) and the second, top spacer 226(2) are designed to reduce the parasitic capacitance of the VCFET 200. It may be desired to not only reduce the contact resistance of the VCFET 200, but also its parasitic capacitance so that the VCFET 200 has better resistance and capacitance (RC) performance characteristics. In this regard, FIG. 2B is another side view of the VCFET 200 in FIG. 2A to illustrate exemplary details of the first, bottom spacer 226(1) and the second, top spacer 226(2). FIGS. 2C and 2D are also partial side view of the VCFET 200 in FIG. 2B to illustrate exemplary details of the second, top spacer 226(2) and the first, bottom spacer 226(1), respectively. The first, bottom spacer 226(1) and the second, top spacer 226(2) of the VCFET 200 designed to reduce its parasitic capacitance will now be discussed in regard to FIGS. 2B-2D.

In this regard, as illustrated in FIG. 2B, the first, bottom spacer 226(1) and the second, top spacer 226(2) are disposed between the gate 218 and the source contact 220 in this example, to insulate the gate 218 from the source and drain contacts 220, 212. The first and second spacers 226(1), 226(2) may be dielectric structures made of a dielectric material, such as an oxide layer or silicon nitride (SiN) as examples. The permittivity of the dielectric material in which the first and second spacers 226(1), 226(2) are made affect the capacitance formed between the source and drain contacts 220, 212 and the gate 218. Thus, it is desired to provide for the first and second spacers 226(1), 226(2) to be of a low permittivity. In this example, to further reduce the permittivity of the first and second spacers 226(1), 226(2), air gaps 228(1), 228(2) are formed in the respective dielectric structures of the first and second spacers 226(1), 226(2) to reduce the overall average permittivity of the first and second spacers 226(1), 226(2). This has the effect of reducing the parasitic capacitance of the VCFET 200.

FIG. 2C illustrates a side view of the second, top spacer 226(2) of the VCFET 200. As shown therein, the second spacer 226(2) is disposed adjacent to the second end surface 208(2) of the first channel portion 204(1), which is also adjacent to the third end surface 208(3) of the second channel portion 204(2). The second spacer 226(2) surrounds the second channel portion 204(2) of the vertical channel 202. The second spacer 226(2) includes a plurality of air gaps 228(1), 228(2) disposed between adjacent dielectric layers 230. Since air has a permittivity of 1.0, and the permittivity of the dielectric layers 230 is greater than 1.0, the introduction of the air gaps 228(1), 228(2) in the second spacer 226(2) reduces the overall permittivity of the second spacer 226(2). As also shown in FIG. 2C, the second spacer 226(2) also includes spacer sidewall 232 that extends along a longitudinal axis $A_3$ in the vertical direction (Z-axis direction) orthogonal the substrate surface 205 (FIG. 2B). The spacer sidewall 232 is disposed between the gate 218 and the source contact 220. As shown in FIG. 2D, the spacer sidewall 232 also extends down adjacent to the first, bottom spacer 226(1).

With continued reference to FIG. 2C, in this example of the VCFET 200, the second spacer 226(2) also includes the air gaps 228(1), 228(2) that are elongated and extend in a first length $L_1$ in the horizontal direction (X-axis direction) parallel to the substrate surface 205 (FIG. 2B). The air gaps 228(1), 228(2) also each have a height $H_5$ in the vertical direction (Z-axis direction), such that the height $H_5$ is less than the length $L_1$ of the air gaps 228(1), 228(2). By providing for the air gaps 228(1), 228(2) in the second spacer 226(2) to be elongated in the horizontal direction by having its heights $H_5$ being less than its lengths $L_1$, the air gaps 228(1), 228(2) have the effect of contributing series capacitance to the parasitic capacitance between the gate 218 and the drain contact 212 and/or the source contact 220 because of the orientation of the air gap 228(1), 228(2) with respect to an electric field that is created in the vertical channel 202 when a voltage differential is applied between the gate 218 and the source 214. Added series capacitance to the parasitic capacitance between the gate 218 and the drain contact 212 and/or the source contact 220 reduces the parasitic capacitance between the gate 218 and the drain contact 212 and/or the source contact 220, and thus the overall parasitic capacitance of the VCFET 200.

Similar to the second, top spacer 226(2) in the VCFET 200 shown in FIG. 2C, the VCFET 200 also includes the first, bottom spacer 226(1) as shown in FIG. 2D. FIG. 2D illustrates a side view of the first, bottom spacer 226(1) of the VCFET 200. As shown therein, the first spacer 226(1) is disposed adjacent to the second end surface 208(2) of the first channel portion 204(1), which is also adjacent to the first end surface 208(1) of the first channel portion 204(1) of the vertical channel 202. The first spacer 226(1) surrounds a portion of the first channel portion 204(1) of the vertical channel 202. Like the second, top spacer 226(2), the first, bottom spacer 226(1) includes a plurality of air gaps 234(1), 234(2) disposed between adjacent dielectric layers 236. Since air has a permittivity of 1.0, and the permittivity of the dielectric layers 236 is greater than 1.0, the introduction of the air gaps 234(1), 234(2) in the first spacer 226(1) reduces the overall permittivity of the first spacer 226(1). In this example of the VCFET 200, the first spacer 226(1) also includes the air gaps 234(1), 234(2) that are elongated and extend in the first length $L_1$ in the horizontal direction (X-axis direction) parallel to the substrate surface 205 (FIG. 2B). The lengths $L_1$ of the air gaps 228(1), 228(2) in the second spacer 226(2) and the air gaps 234(1), 234(2) in the first spacer 226(1) are the same in this example, but do not have to be the same. The air gaps 234(1), 234(2) also each have a height $H_5$ in the vertical direction (Z-axis direction), such that the height $H_5$ is less than the length $L_1$ of the air gaps 228(1), 228(2). The heights $H_5$ of the air gaps 228(1), 228(2) in the second spacer 226(2) and the air gaps 234(1), 234(2) in the first spacer 226(1) are the same in this example, but do not have to be the same.

By providing for the air gaps 234(1), 234(2) in the first spacer 226(1) to be elongated in the horizontal direction by having its heights $H_5$ being less than its lengths $L_1$, the air gaps 234(1), 234(2) have the effect of contributing series capacitance to the parasitic capacitance between the gate 218 and the source contact 220 because of the orientation of the air gaps 234(1), 234(2) with respect to an electric field that is created in the vertical channel 202 when a voltage differential is applied between the gate 218 and the source 214. Added series capacitance to the parasitic capacitance between the gate 218 and the source contact 220 reduces the parasitic capacitance between the gate 218 and the source contact 220, and thus the overall parasitic capacitance of the VCFET 200.

Note that the source 214 and drain 210 in the VCFET 200 in FIGS. 2A-2D can be reversed in an alternative arrangement. In this alternative arrangement, the drain 210 can be disposed in the well 216 and the source 214 is disposed adjacent to the fourth end surface 208(4) of the second channel portion 204(2) of the vertical channel 202.

Figure 4:
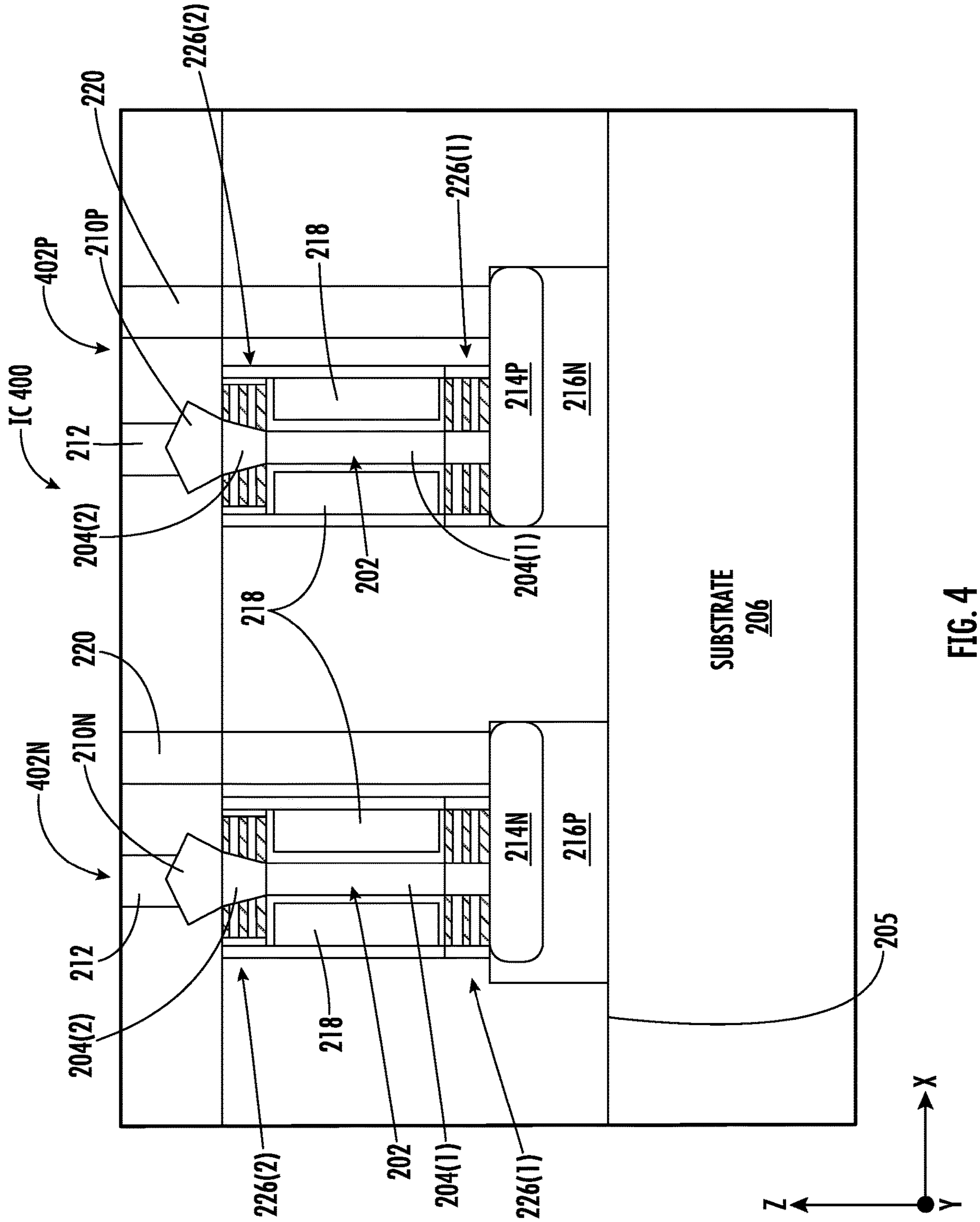
FIG. 4 is a side view of another exemplary IC that includes VCFETs like shown in FIGS. 2A and 2B in the form of a N-type VCFET and a P-type VCFET disposed on a substrate and that can be used in a complementary metal oxide semiconductor (CMOS) circuit, wherein the N-type and P-type VCFETs include a vertical channel with an end portion expanded in width in a horizontal direction perpendicular to the height of the vertical channel to reduce contact resistance, and/or a spacer that includes one or more horizontal air gaps elongated in the horizontal direction to reduce the parasitic capacitance between the gate and the contact.

A VCFET, like the VCFET 200 in FIGS. 2A-2D, can be provided in an integrated circuit (IC) in the form of NMOS and PMOS devices/transistors to form CMOS circuits. In this regard, FIG. 4 is a side view of an exemplary IC 400 that includes an N-type VCFET 402N as an NMOS device/transistor and a P-type VCFET 402P as a PMOS device/transistor. Common elements between the IC 400 and the VCFET 200 in FIGS. 2A-2D are shown with common element numbers. As shown in FIG. 4, the N-type VCFET 402N and the P-type VCFET 402P are formed on a common substrate 206. The N-type VCFET 402N and the P-type VCFET 402P can be formed like the structure of the VCFET 200 in FIGS. 2A-2D. For the N-type VCFET 402N, its source 214N and the drain 210N are N-type sources and drains. The source 214N is formed in a P-type well 216P. For the P-type VCFET 402P, its source 214P and the drain 210P are P-type sources and drains. The source 214P is formed in an N-type well 216N.

Figure 5:
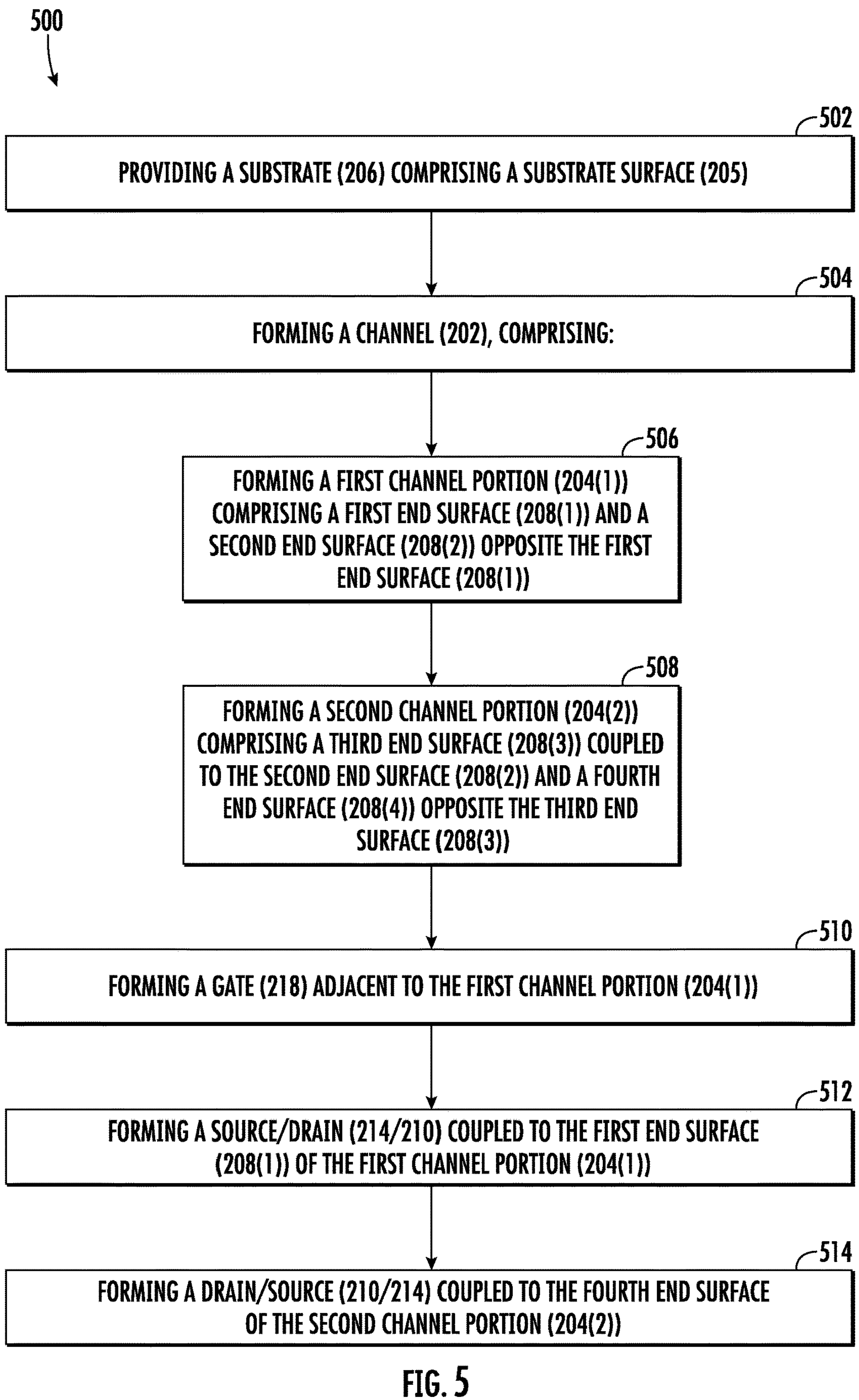
FIG. 5 is a flowchart illustrating an exemplary fabrication process of fabricating a VCFET that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, including but not limited to the VCFETs in FIGS. 2A-3.

A VCFET, including but not limited to the VCFETs 200, 402N, 402P in FIGS. 2A-2D and 4, that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, can be fabricated according to various processes. For example, FIG. 5 is a flowchart illustrating an exemplary fabrication process 500 of fabricating a VCFET that includes a vertical channel with an end portion to reduce contact resistance, and/or a spacer between the gate and the contact to reduce the overall average permittivity of the spacer, and thus reduce the parasitic capacitance of the VCFET. The fabrication process 500 in FIG. 5 is discussed in reference to the VCFET in FIGS. 2A-2D, but note that the fabrication process 500 is not limited to fabricating the VCFET 200 in FIGS. 2A-2D, and could be used to fabricate the VCFETs 402N, 402P in FIG. 4 or other VCFETs.

In this regard, as shown in FIG. 5, a step of the fabrication process 500 can be providing a substrate 206 comprising a substrate surface 205 (block 502 in FIG. 5). A next step of the fabrication process 500 can be forming a vertical channel 202 (block 504 in FIG. 5). Forming the vertical channel 202 can comprise forming a first channel portion 204(1) comprising a first end surface 208(1) and a second end surface 208(2) opposite the first end surface 208(1) (block 506 in FIG. 5). The first channel portion 204(1) can have a first height $H_3$ in a first direction (Z-axis direction) orthogonal to the substrate surface 205. The second end surface 208(2) can have a first width $W_3$ less than the first height $H_4$ in a second direction (X-axis direction) parallel to the substrate surface 205. Forming the vertical channel 202 can also comprise forming a second channel portion 204(2) comprising a third end surface 208(3) coupled to the second end surface 208(2) and a fourth end surface 208(4) opposite the third end surface 208(3) (block 508 in FIG. 5). The second channel portion 204(2) can have a second height $H_4$ in the first direction (Z-axis direction). The fourth end surface 208(4) can have a second width $W_2$ in the second direction (X-axis direction) greater than the first width $W_3$. Another step in the fabrication process 500 can include forming a gate 218 adjacent to the first channel portion 204(1) (block 510 in FIG. 5). Another step in the fabrication process 500 can include forming a source/drain 214/210 coupled to the first end surface 208(1) of the first channel portion 204(1) (block 512 in FIG. 5). Another step in the fabrication process 500 can include forming a drain/source 210/214 coupled to the fourth end surface of the second channel portion 204(2) (block 514 in FIG. 5).

A VCFET IC that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, can be fabricated according to various processes, including, but not limited to, the VCFETs 200, 402N, 402P in FIGS. 2A-2D and 4, and can be fabricated in other fabrication processes. For example, FIGS. 6A-6G is a flowchart illustrating another exemplary fabrication process 600 of fabricating an IC that includes VCFETs that include a vertical channel with an end portion expanded in width in a horizontal direction perpendicular to the height of the vertical channel, and/or a spacer between the gate and the contact that includes one or more horizontal air gaps elongated in the horizontal direction to reduce the overall average permittivity of the spacer. FIGS. 7A-7M are exemplary fabricating stages 700A-700M during the fabricating of the IC and its VCFETs according to the fabrication process 600 in FIGS. 6A-6G. The fabrication process 600 in FIGS. 6A-6G is discussed below with reference to the fabrication stages 700A-700M in FIGS. 7A-7M, which are in reference to the VCFET 200, but such is not limited.

Figure 7A:
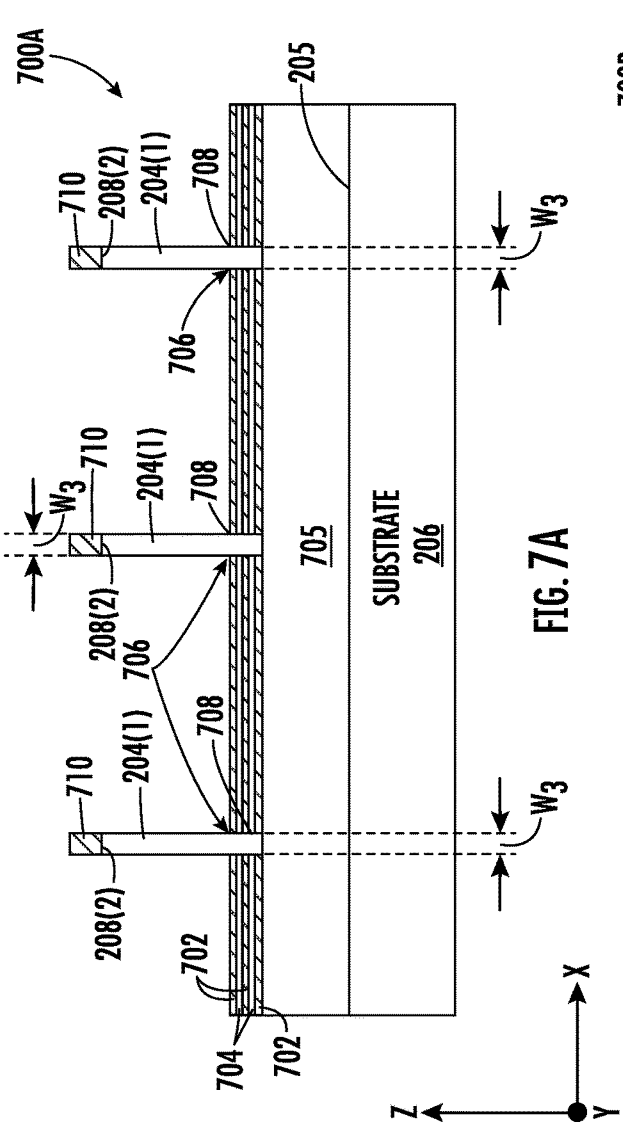
FIGS. 7A-7M are exemplary fabricating stages in the fabricating of the IC in FIGS. 6A-6G.
Figure 6A:
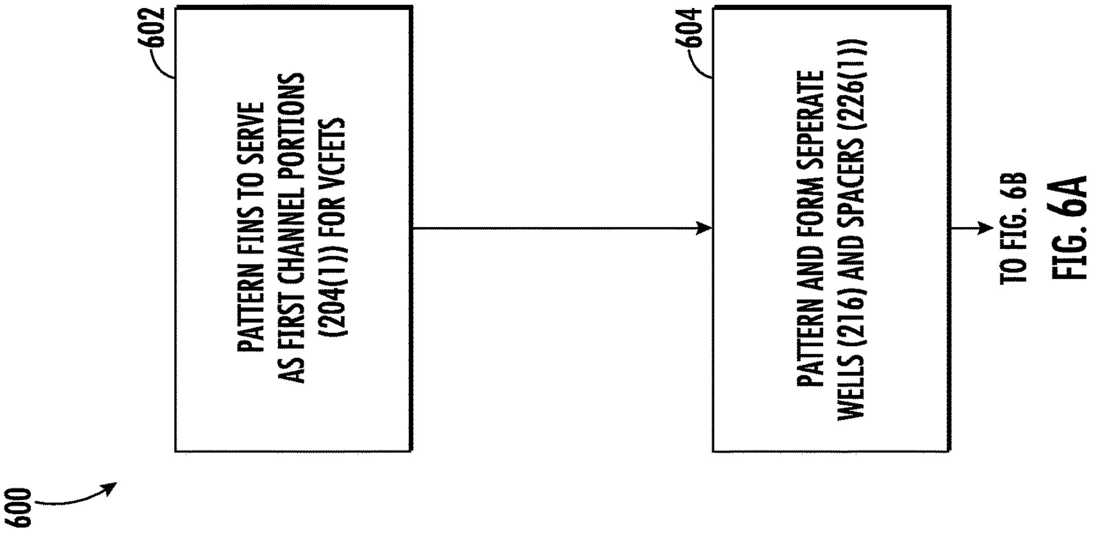
FIGS. 6A-6G is a flowchart illustrating another exemplary fabrication process of fabricating an IC that includes VCFETs that include a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, including but not limited to the vertical VCFETs in FIG. 3.

As shown in the exemplary fabrication stage 700A in FIG. 7A, a first step in the fabrication process 600 is to pattern fins to serve as the first channel portions 204(1) of the vertical channels 202 for a plurality of VCFETs (block 602 in FIG. 6A). As shown in FIG. 7A, the substrate 206 is provided. The well layer 705 in which the wells 216 will be formed (see FIG. 7B), is formed on the substrate surface 205 of the substrate 206. To prepare what will become the first, bottom spacers 226(1) of VCFETs and to form the air gaps 234(1), 234(2) therein as shown in FIG. 2D, first and second dielectric layers 702, 704 are disposed on the well layer 705 in an alternating fashion as shown in fabrication stage 700A in FIG. 7A. The well layer 705 will be implanted with a P-type material to form a P-type well if the VCFET to be formed is an NMOS device. The well layer 705 will be implanted with an N-type material to form an N-type well if the VCFET to be formed is a PMOS device. The first dielectric layers 702 are layers that will remain as part of the first, bottom spacers 226(1). For example, the first dielectric layers 702 may be layers made of SiN. The second dielectric layers 704 are layers that are sacrificial layers and will eventually be removed in a later processing step to leave voids that will form the air gaps 234(1), 234(2) for the first, bottom spacers 226(1). The first and second dielectric layers 702, 704 are then patterned and dry etched in this example to form openings 706 of width $W_3$ to define eventual sidewalls 708 of the first channel portions 204(1). The first channel portions 204(1) are formed in openings 706, such as by growing silicon material in the openings 706. Hard marks 710 made of a material that is not susceptible to etching (e.g., SiN) are deposited on the second end surfaces 208(2) of the first channel portions 204(1) to protect the first channel portions 204(1) during subsequent processing steps.

Figure 7B:
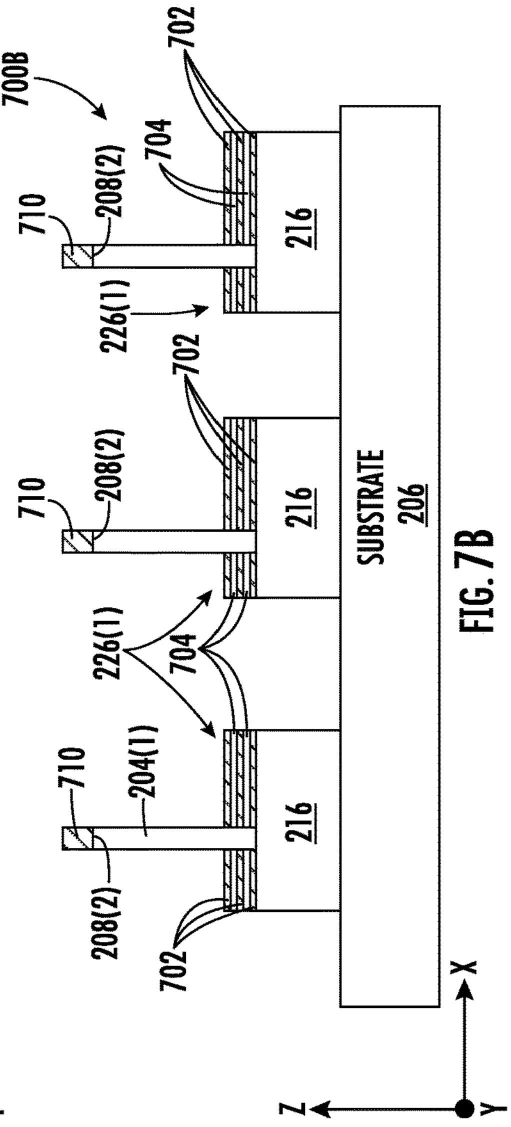

Then, as shown in the exemplary fabrication stage 700B in FIG. 7B, the well layer 705 is patterned to form the separate wells 216 (block 604 in FIG. 6A). As part of patterning the wells 216, the first, bottom spacers 226(1) are also patterned so that the portion of the first and second dielectric layers 702, 704 outside of the wells 216 in the vertical direction (Z-axis direction) are also removed. For example, an etching process may be used to pattern the wells 216. The hard masks 710 formed on the second end surfaces 208(2) of the first channel portions 204(1) protect the first channel portions 204(1) during the patterning of the wells 216 and first spacers 226(1).

Figure 7C:
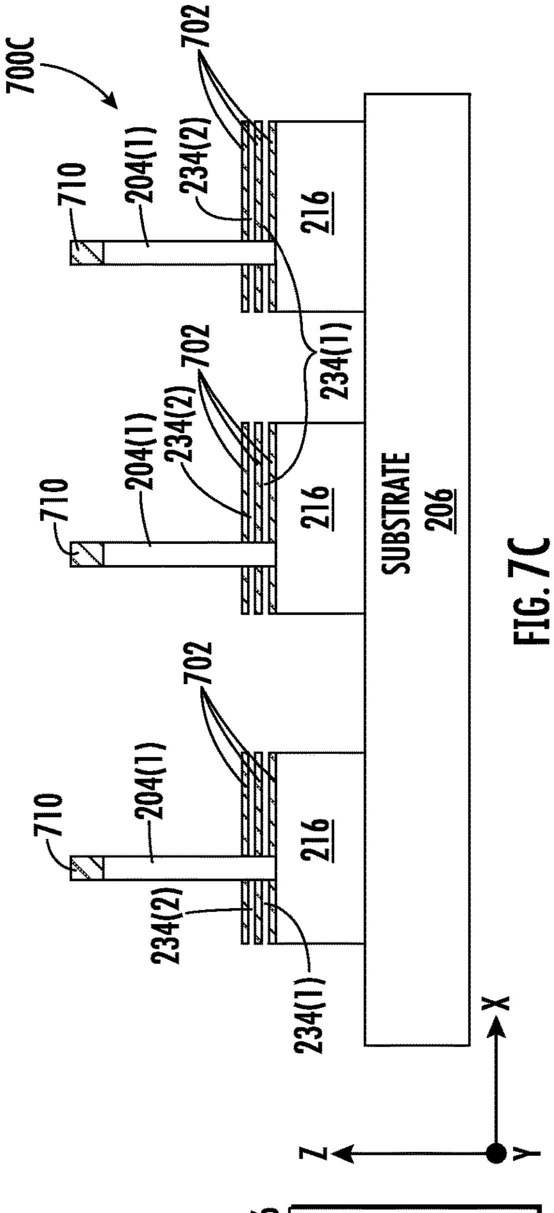
Figure 7D:
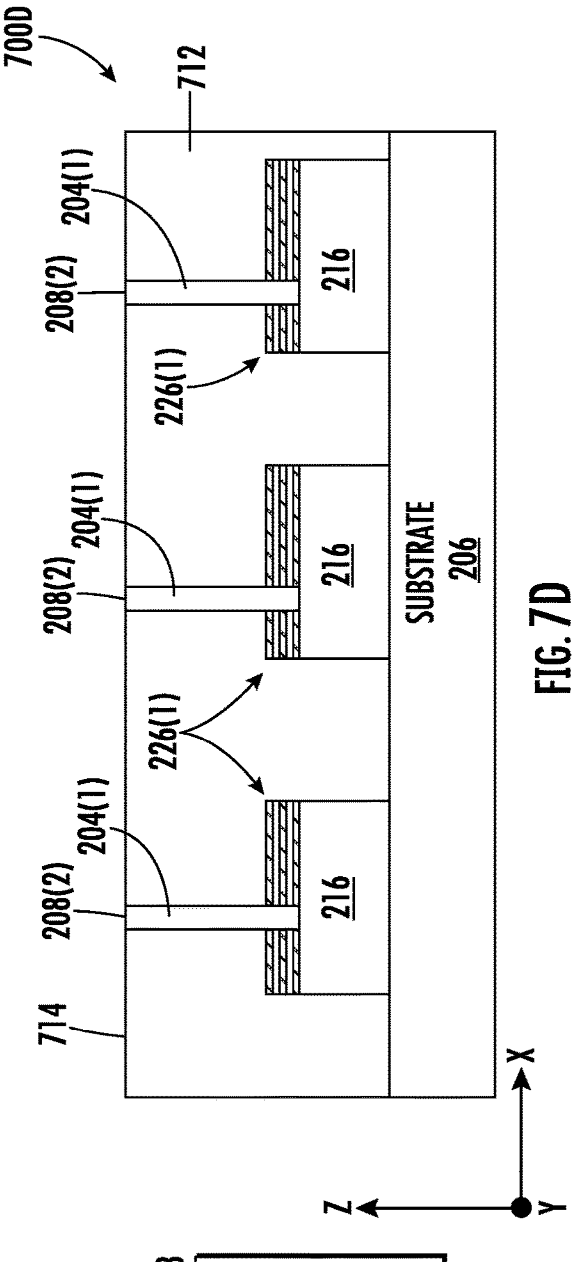
Figure 6B:
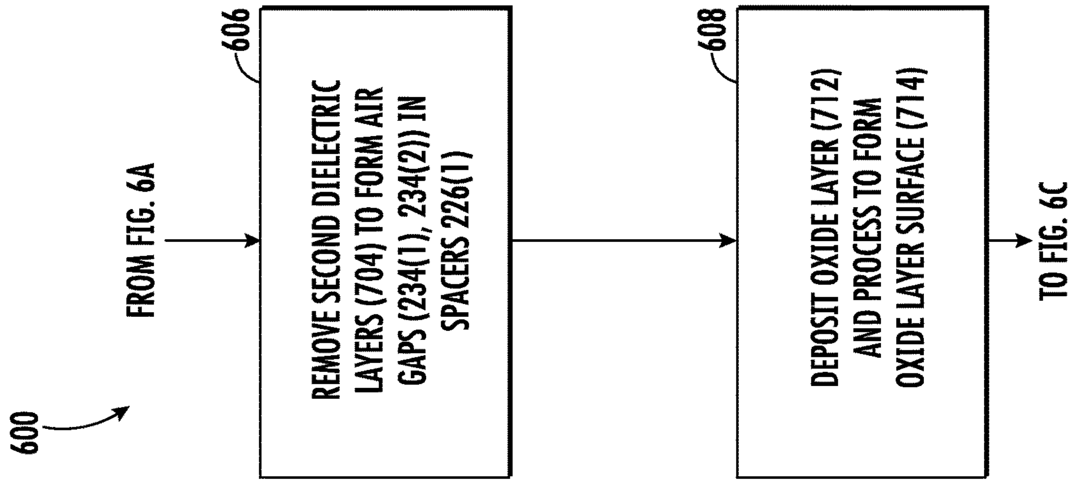

Then, as shown in the exemplary fabrication stage 700C in FIG. 7C, to form the air gaps 234(1), 234(2) in the first spacers 226(1), the second dielectric layers 704 are removed (block 606 in FIG. 6B). For example, the second dielectric layers 704 may be removed by a wet etch process, such as with a dilute hydrofluoric acid (DHF). Then, as shown in the exemplary fabrication stage 700D in FIG. 7D, to prepare the top, second spacers 226(2) (FIG. 2C) to be formed adjacent to the second end surfaces 208(2) of the first channel portions 204(1), an oxide layer 712 is deposited on the substrate surface 205 outside of the wells 216 and on the first spacers 226(1) and surrounding the first channel portions 204(1) (block 608 in FIG. 6B). The oxide layer 712 is then processed, such as through a chemical mechanical polish (CMP) process to from a oxide layer surface 714 that is co-planar with the second end surfaces 208(2) of the first channel portions 204(1).

Figure 6C:
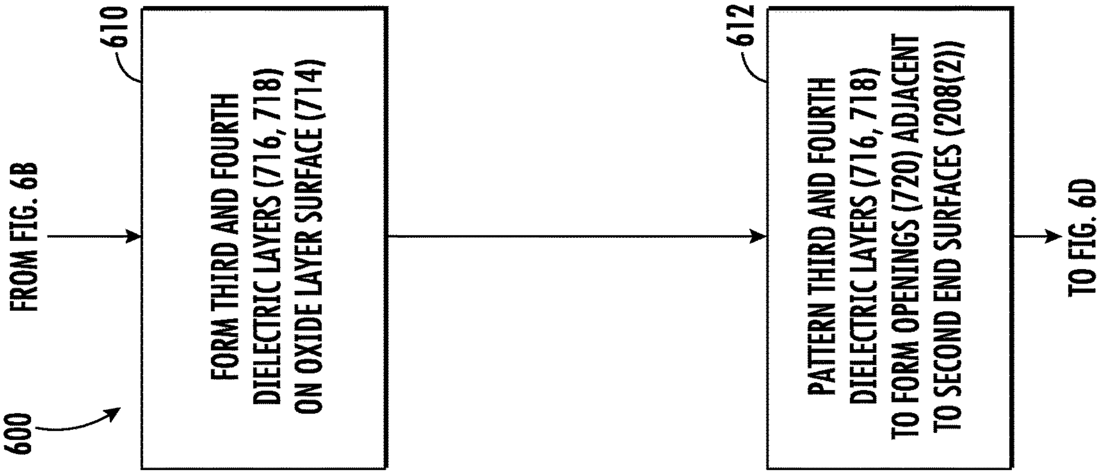
Figure 7E:
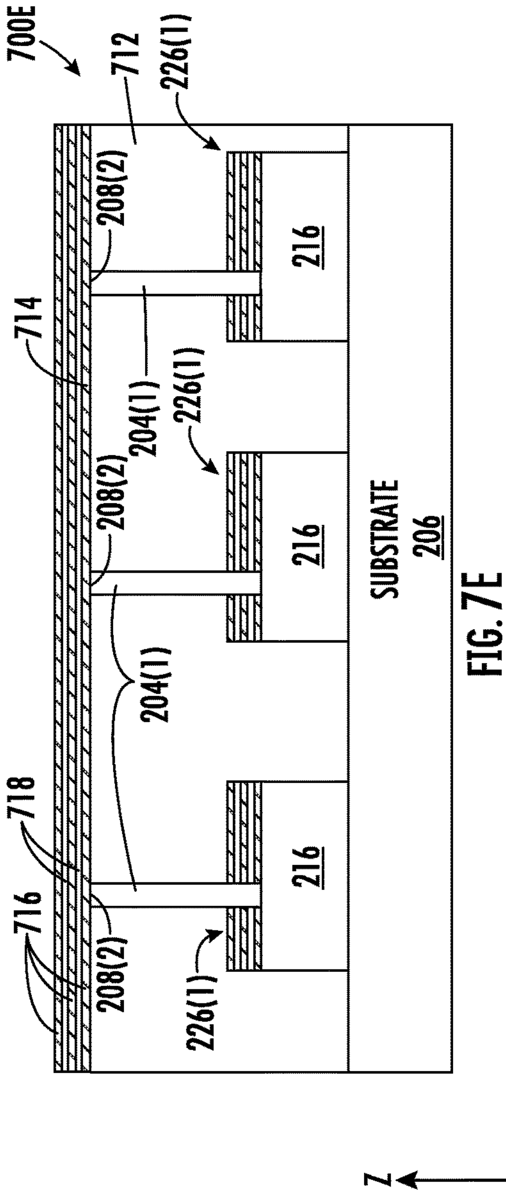
Figure 7F:
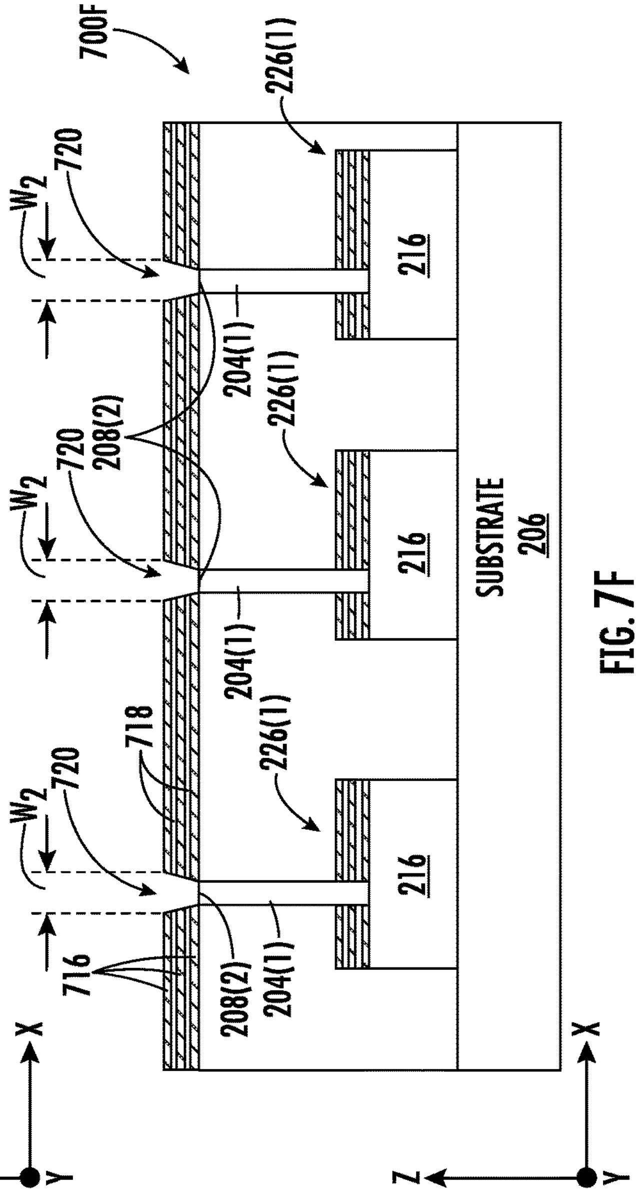

Then, as shown in the exemplary fabrication stage 700E in FIG. 7E, to prepare what will become the second, top spacers 226(2) of VCFETs and to form the air gaps 228(1), 228(2) therein as shown in FIG. 2C, third and fourth dielectric layers 716, 718 are disposed on the oxide layer surface 714 and the second end surfaces 208(2) of the first channel portions 204(1) in an alternating fashion (block 610 in FIG. 6C). The third dielectric layers 716 are layers that will remain as part of the second, top spacers 226(2). For example, the third dielectric layers 716 may be layers made of SiN. The fourth dielectric layers 718 are layers that are sacrificial layers and will eventually be removed in a later processing step to leave voids that will form the air gaps 228(1), 228(2) for the second, top spacers 226(2). Then, as shown in the exemplary fabrication stage 700F in FIG. 7F, to prepare the second channel portions 204(2) to be formed in contact with the second end surfaces 208(2) of the first channel portions 204(1), the third and fourth dielectric layers 716, 718 are patterned to form openings 720 above and down to the second end surfaces 208(2) of the first channel portions 204(1) (block 612 in FIG. 6C). The openings 720 are formed so that a fourth end surface 208(4) of second channel portions 204(2) to be formed in the openings 720 will be of width $W_2$ as shown in FIG. 2A.

Figure 7G:
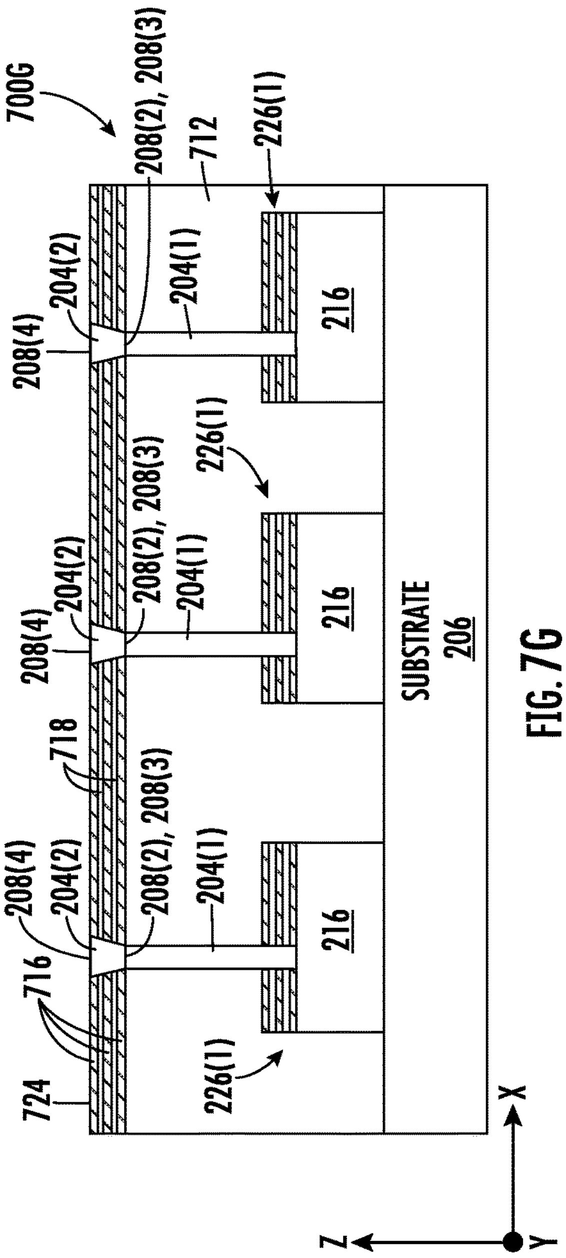
Figure 7H:
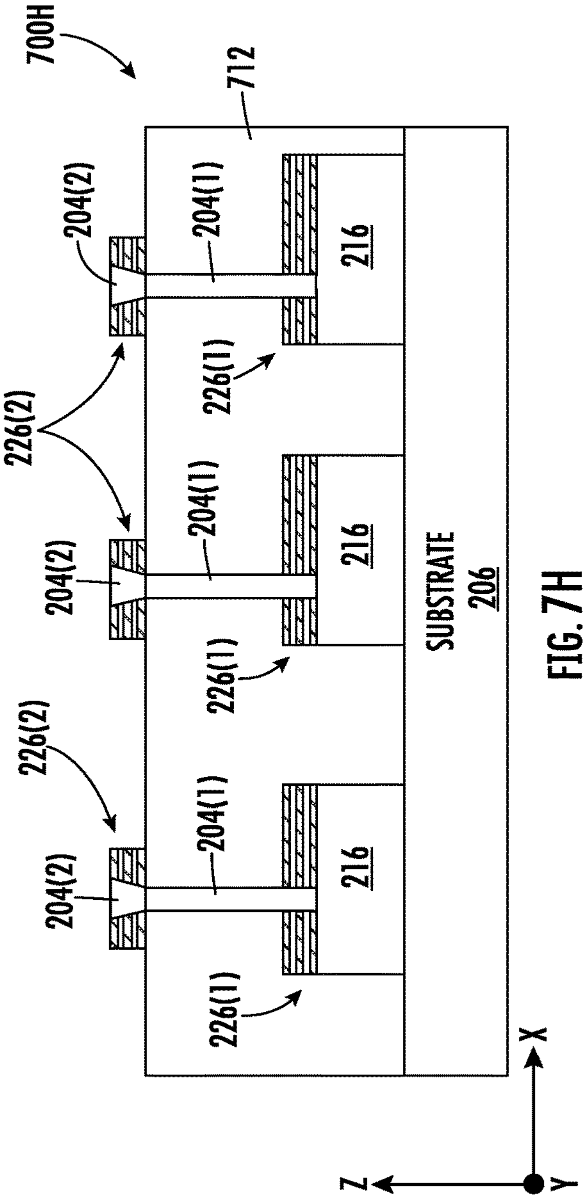
Figure 6D:
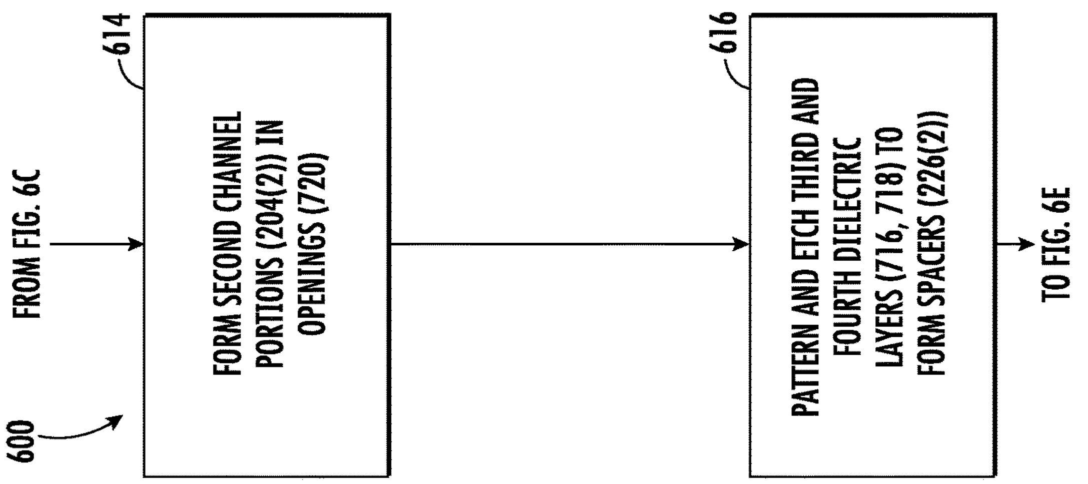

Then, as shown in the exemplary fabrication stage 700G in FIG. 7G, the second channel portions 204(2) are formed in the openings 720 patterned in the third and fourth dielectric layers 716, 718 (block 614 in FIG. 6D). For example, the second channel portions 204(2) may be formed by growing silicon material in the openings 720. The second channel portions 204(2) are formed such that their bottom, third end surfaces 208(3) is formed on the second end surfaces 208(2) of the first channel portions 204(1). Fourth end surfaces 208(4) are formed at the top of the second channel portions 204(2), which may be processed, such as through CMP process, to make the fourth end surfaces 208(4) co-planar with an outside surface 724 of the top-most third dielectric layer 716. Then, as shown in the exemplary fabrication stage 700H in FIG. 7H, the third and fourth dielectric layers 716, 718 in FIG. 7G are then patterned and dry etched in this example to form the second, top spacers 226(2) (block 616 in FIG. 6D).

Figure 7I:
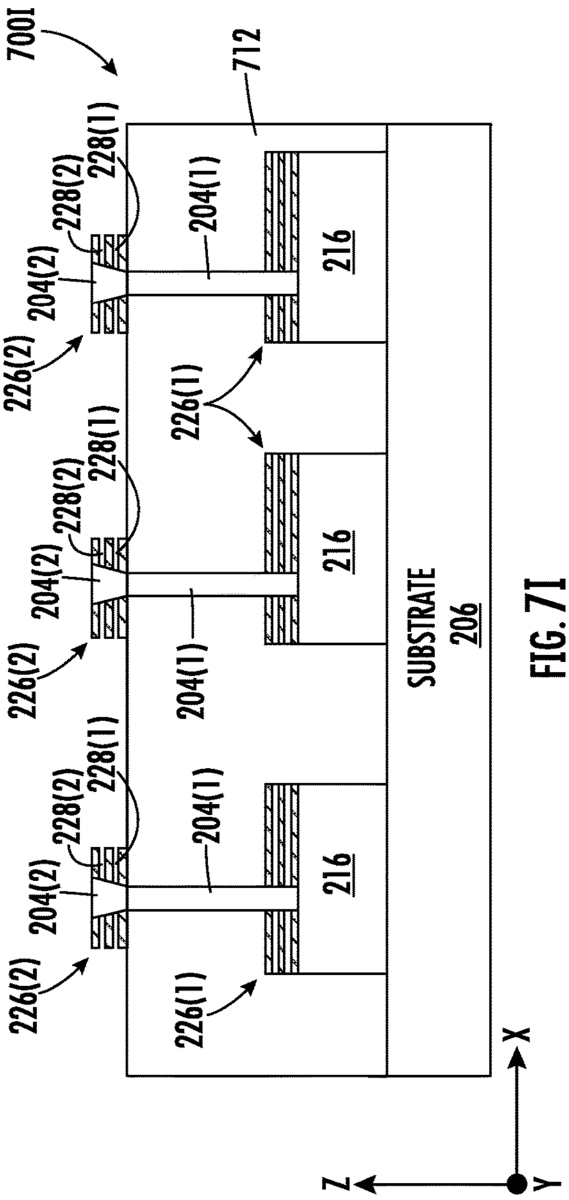
Figure 7J:
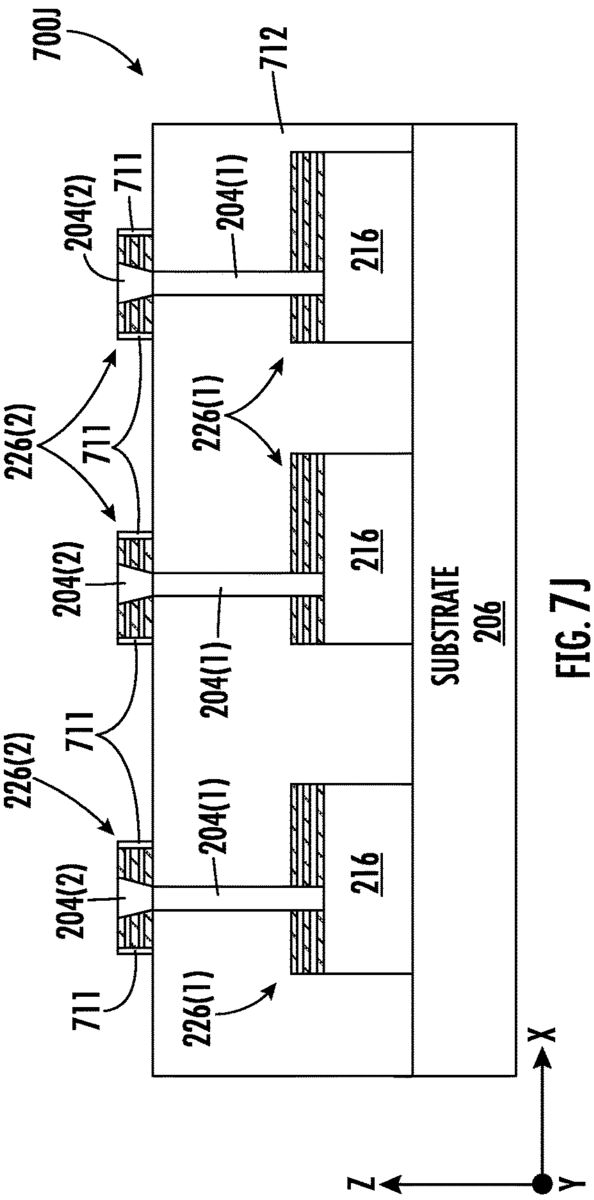
Figure 6E:
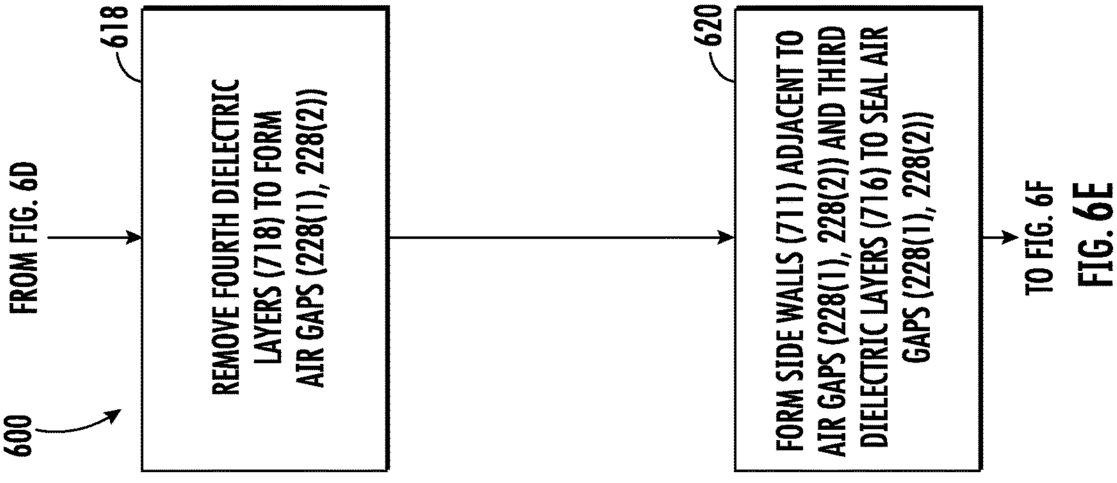
Figure 6F:
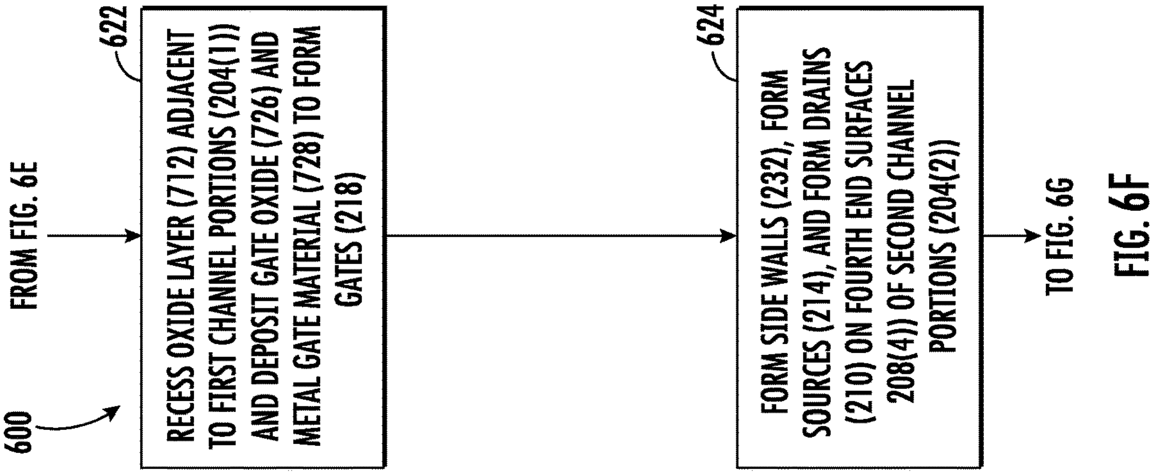

Then, as shown in the exemplary fabrication stage 700I in FIG. 7I, to form the air gaps 228(1), 228(2) in the second, top spacers 226(2), the fourth dielectric layers 718 are removed (block 618 in FIG. 6E). For example, the fourth dielectric layers 718 may be removed by a wet etch process, such as with a dilute hydrofluoric acid (DHF). Then, as shown in the exemplary fabrication stage 700J in FIG. 7J, sidewalls 711 are formed adjacent to the air gaps 228(1), 228(2) and third dielectric layers 716 of the second spacers 226(2) to seal off the air gaps 228(1), 228(2) (block 620 in FIG. 6E). Then, as shown in the exemplary fabrication stage 700K in FIG. 7K, the oxide layer 712 is recessed adjacent to the first channel portions 204(1) to form a shallow trench (block 622 in FIG. 6F). A gate oxide 726 as an insulator is then deposited in the recess adjacent to the first channel portions 204(1), and a metal gate material 728 is then deposited on the gate oxide 726 to form the gates 218 (block 622 in FIG. 6F). Then, as shown in the exemplary fabrication stage 700L in FIG. 7L, the spacer sidewalls 232 are formed adjacent to the gate 218 and the first and second spacers 226(1), 226(2) (block 624 in FIG. 6F). The wells 216 are also patterned and recessed to epitaxially deposit the sources 214 in the well 216 in contact with the first end surfaces 208(1) of the first channel portions 204(1) (block 624 in FIG. 6F). The drains 210 are also epitaxially grown on the fourth end surfaces 208(4) of the second channel portions 204(2) with their expanded surface areas versus the surface area of the second end surfaces 208(2) of the first channel portions 204(1) (block 624 in FIG. 6F). At this point, three (3) VCFETs 200(1)-200(3) are formed.

Figure 7K:
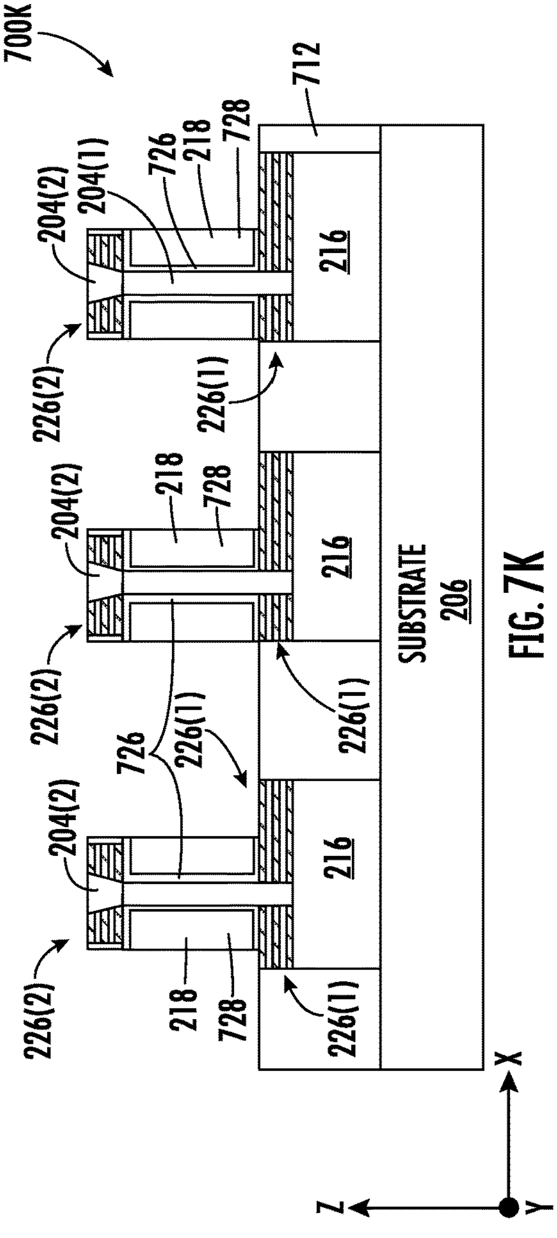
Figure 7L:
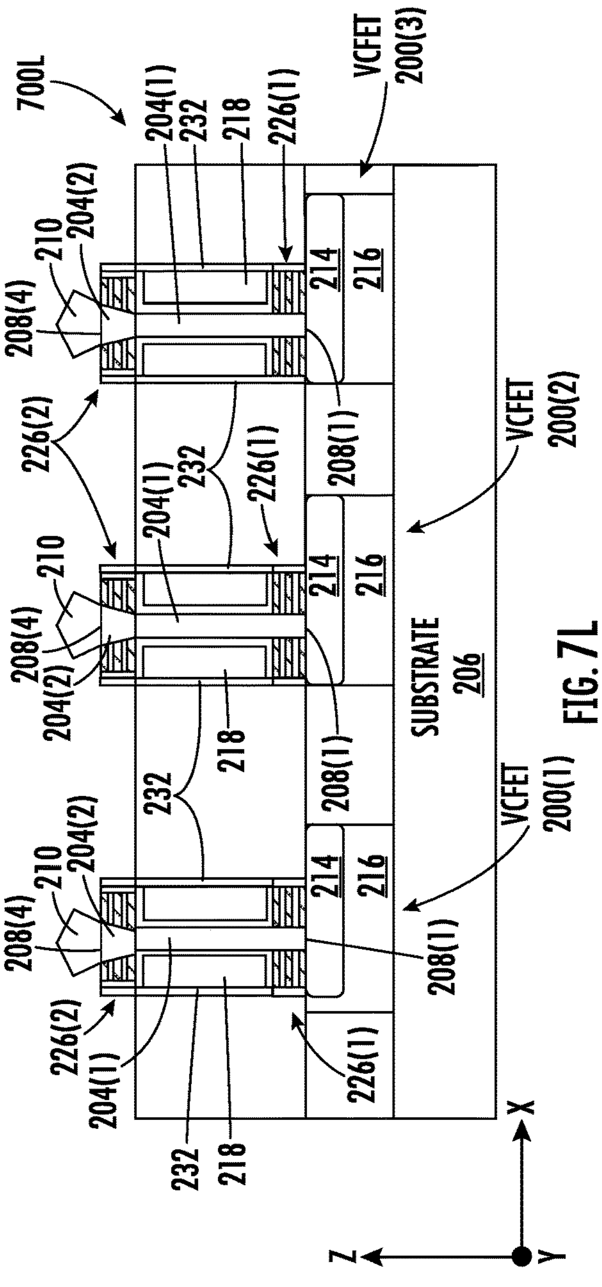
Figure 7M:
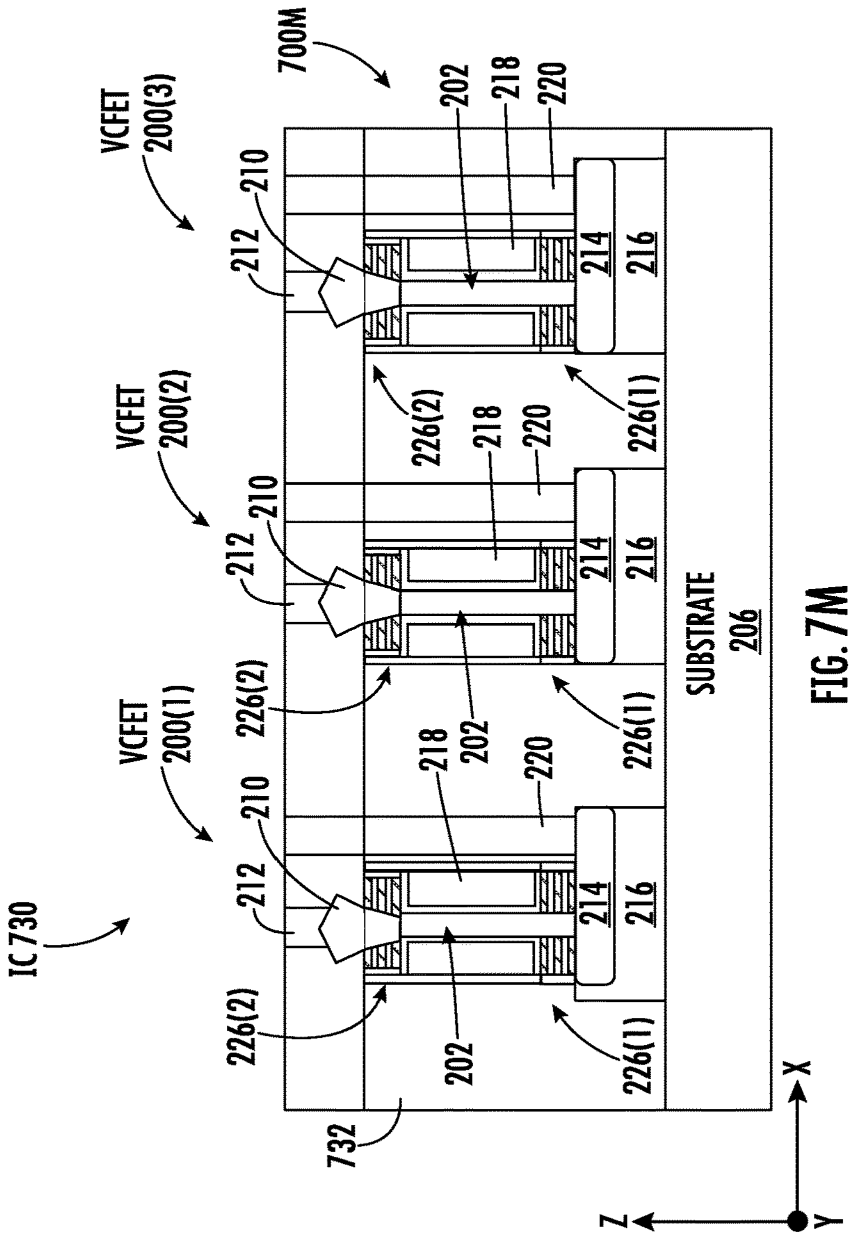
Figure 6G:
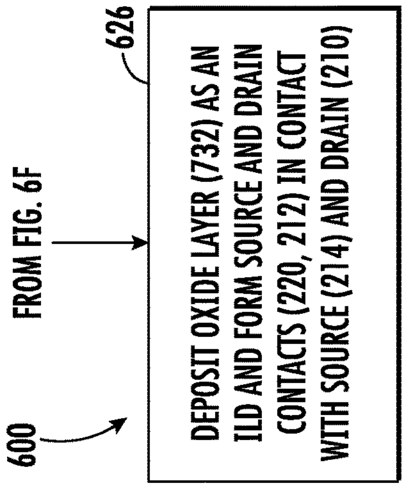

Then, as shown in the exemplary fabrication stage 700M in FIG. 7M, to finalize the fabrication of the IC 730, another oxide layer 732 is deposited over the substrate 206 and the VCFETs 200(1)-200(3) as an interlayer dielectric (ILD) (block 626 in FIG. 6G). The source and drain contacts 220, 212 are patterned and formed in the oxide layer 732 and in contact with the respective source 214 and drain 210 to form connections to the respective source 214 and drain 210 of the VCFETs 200(1)-200(3) (block 626 in FIG. 6G).

It should be understood that the terms source/drain can mean either a source or a drain. The term drain/source can mean either a drain or a source. When source/drain and drain/source are discussed in regard to an example of a VCFET, if a first element is referred to as a source/drain, and a second element is referred to as a drain/source, if the first element is a source, the second element is a drain, and vice versa—if the first element is a drain, the second element is a source. It should also be understood that the terms "first," "second," "third," "fourth," etc., where used herein, are relative terms and are not meant to limit or imply an order or other orientation. It should also be understood that the terms "top," "above," "bottom," "below," where used herein, are relative terms and are not meant to limit or imply a strict orientation. A "top" referenced element does not always need to be oriented to be above a "bottom" referenced element with respect to ground, and vice versa. An element referenced as "top" or "bottom" may be on top or bottom relative to that example only and the particular illustrated example. An element referenced as "above" or "below" another element does not have to be with respect to ground, and vice versa. An element referenced as "above" or "below" may be above or below such other referenced element, relative to that example only and the particular illustrated example. The term "adjacent" between elements does not necessarily require such elements to be physically connected or directly adjacent to each other without the presence of intervening elements.

VCFETs that include a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET including, but not limited to, the VCFETs 200, 402N, 402P, 200(1)-200(3) in FIGS. 2A-2D, 4 and 7A-7M, and fabricated according to any of the fabrication processes 500, 600 in FIGS. 5-6G, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
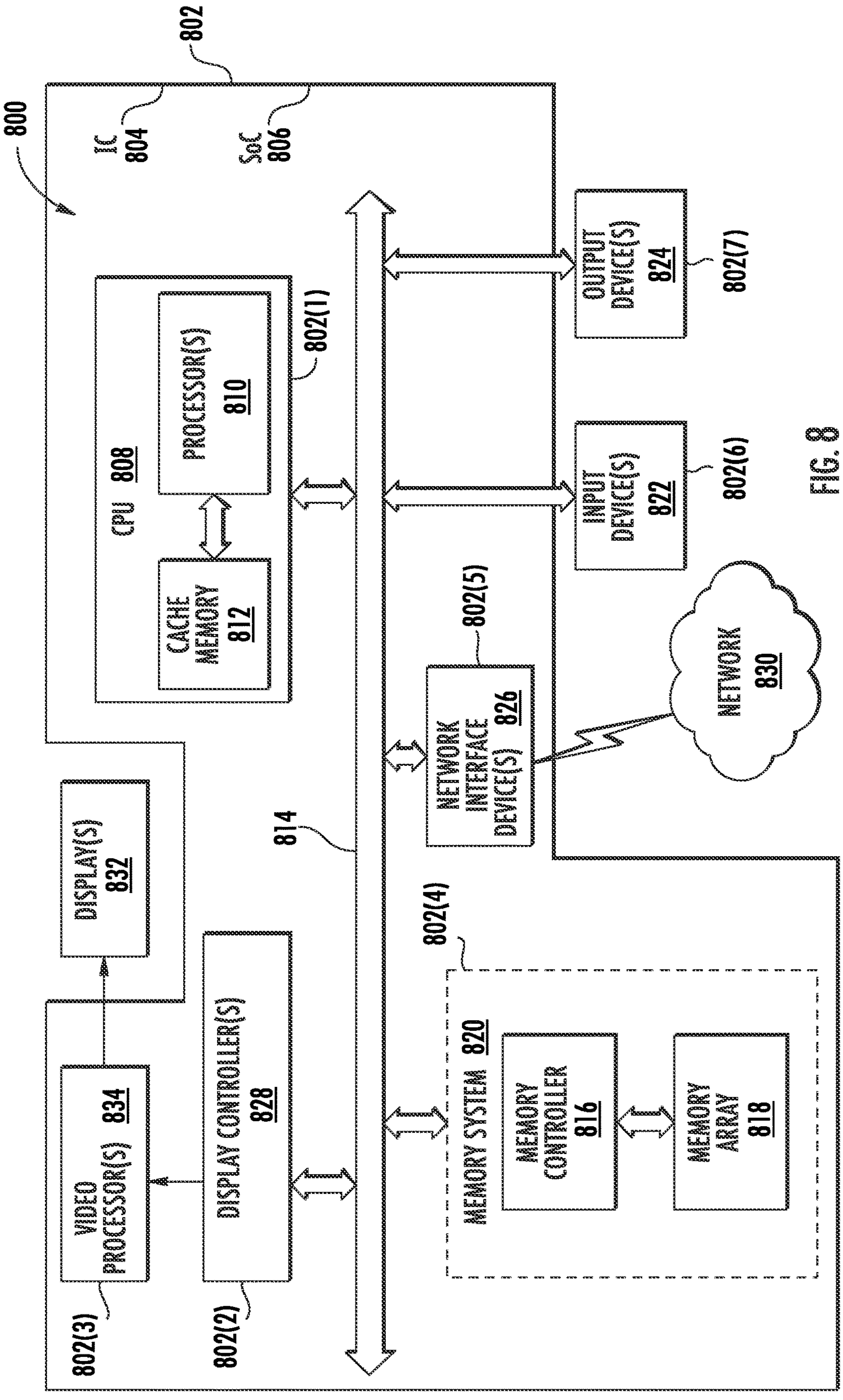
FIG. 8 is a block diagram of an exemplary wireless communication device that includes electrical components that can include an IC that includes a VCFET(s) that includes a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET, including but not limited to the VCFETs in FIGS. 2A-3, and fabricated according to a fabrication process, including but not limited to the exemplary fabrication processes in FIGS. 5-6G.

In this regard, FIG. 8 illustrates an example of a processor-based system 800 that can include one or more VCFETs 802, 802(1)-802(7) that include a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET including, but not limited to, the VCFETs 200, 402N, 402P, 200(1)-200(3) in FIGS. 2A-2D, 4 and 7A-7M, and fabricated according to any of the fabrication processes 500, 600 in FIGS. 5-6G, and according to any aspects disclosed herein, may be provided in or integrated into any processor-based device. In this example, the processor-based system 800 may be formed as an IC 804, and as part of an IC package such as system-on-a-chip (SoC) 806. The processor-based system 800 includes a central processing unit (CPU) 808 that includes one or more processors 810, which may also be referred to as CPU cores or processor cores. The CPU 808 may have cache memory 812 coupled to the CPU 808 for rapid access to temporarily stored data. The CPU 808 is coupled to a system bus 814 and can intercouple master and slave devices included in the processor-based system 800. As is well known, the CPU 808 communicates with these other devices by exchanging address, control, and data information over the system bus 814. For example, the CPU 808 can communicate bus transaction requests to a memory controller 816, as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The CPU 808 may also be configured to access the display controller(s) 828 over the system bus 814 to control information sent to one or more displays 832. The display controller(s) 828 sends information to the display(s) 832 to be displayed via one or more video processor(s) 834, which processes the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc.

FIG. 9 illustrates an exemplary wireless communications device 900 that includes electrical components formed from one or more ICs 902, wherein any of the ICs 902 can include one or more VCFETs 903 that include a vertical channel with an end portion expanded in width in a horizontal direction perpendicular to the height of the vertical channel to reduce contact resistance, and/or a spacer between the gate and the contact that includes one or more horizontal air gaps elongated in the horizontal direction to reduce the overall average permittivity of the spacer, and thus reduce the parasitic capacitance of the VCFET including, but not limited to, the VCFETs 200, 402N, 402P 200(1)-200(3) in FIGS. 2A-2D, 4 and 7A-7M, and fabricated according to any of the fabrication processes 500, 600 in FIGS. 5-6G, and according to any aspects disclosed herein. The wireless communications device 900 may include or be provided in any of the above referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are also described in the following numbered clauses:

1. A vertical channel field-effect transistor (VCFET), comprising:
   a substrate comprising a substrate surface;
   a channel, comprising:
      a first channel portion comprising a first end surface and a second end surface opposite the first end surface, the second end surface having a first width in a first direction parallel to the substrate surface; and a second channel portion comprising a third end surface coupled to the second end surface and a fourth end surface opposite the third end surface, the fourth end surface having a second width in the first direction greater than the first width;

a gate adjacent to the first channel portion;

a source/drain coupled to the first end surface of the first channel portion; and a drain/source coupled to the fourth end surface of the second channel portion.

2. The VCFET of clause 1, wherein the channel is configured to transport charge in a second direction orthogonal to the substrate surface.

3. The VCFET of clause 1 or 2, wherein a ratio of the second width to the first width is at least 1.1.

4. The VCFET of any of clauses 1-3, wherein:

the first width is between one (1) nanometer (nm) and ten (10) nm; and the second width is between one (1) nm and twenty (20) nm.

5. The VCFET of any of clauses 1-4, wherein:

the first channel portion has a first height in a second direction orthogonal to the substrate surface;

the first width is less than the first height; and the second channel portion has a second height in the second direction.

6. The VCFET of any of clauses 1-5, further comprising:

a first spacer adjacent to the first end surface of the first channel portion and the gate; and a second spacer adjacent to the second end surface of the first channel portion and the gate;

the first spacer comprising at least one first air gap; and the second spacer comprising at least one second air gap.

7. The VCFET of clause 6, further comprising:

a spacer sidewall extending in a second direction orthogonal to the substrate surface and along a first longitudinal axis orthogonal to the substrate surface; and the spacer sidewall adjacent to the first spacer, the second spacer, and the gate.

8. The VCFET of clause 6 or 7, wherein:

each of the at least one first air gap has a first length extending in the first direction parallel to the substrate surface and a first height extending in a second direction orthogonal to the substrate surface; and the first length is greater than the first height; and each of the at least one second air gap has a second length extending in the first direction and a second height extending in the second direction; and the second length is greater than the second height.

9. The VCFET of any of clauses 6-8, wherein:

the at least one first air gap comprises a plurality of first air gaps; and the least one second air gap comprises a plurality of second air gaps.

10. The VCFET of any of clauses 6-9, wherein:

the first spacer comprises a first dielectric structure and the at least one first air gap disposed within the first dielectric structure; and the second spacer comprises a second dielectric structure and the at least one second air gap disposed within the second dielectric structure.

11. The VCFET of clause 10, wherein:

the first dielectric structure comprises Silicon Nitride (SiN); and the second dielectric structure comprises SiN.

12. The VCFET of any of clauses 1-11, further comprising:

a first contact coupled to the source/drain and extending in a second direction orthogonal to the substrate surface and along a first longitudinal axis; and a second contact coupled to the drain/source and extending in the second direction along a second longitudinal axis parallel to the first longitudinal axis.

13. The VCFET of any of clauses 1-12, wherein the first channel portion comprises a first sidewall; and wherein the gate surrounds the first sidewall of the first channel portion.

14. The VCFET of any of clauses 1-13, wherein an effective length of the gate, $L_{eff}$, is defined by a first height of the gate in a second direction orthogonal to the substrate surface.

15. The VCFET of any of clauses 1-14, further comprising an P semiconductor type (P-type) well adjacent to the substrate;

wherein:

the source/drain comprises a N-type source/drain;

the drain/source comprises a N-type drain/source; and the N-type source/drain is disposed in the P-type well.

16. The VCFET of clause 15, wherein a crystal structure for a channel sidewall of the channel is oriented in a <001> plane relative to the substrate surface.

17. The VCFET of any of clauses 1-14, further comprising an N semiconductor type (N-type) well adjacent to the substrate;

wherein:

the source/drain comprises a P-type source/drain;

the drain/source comprises a P-type drain/source; and the P-type source/drain is disposed in the N-type well.

18. The VCFET of clause 17, wherein a crystal structure for a channel sidewall of the channel is oriented in a <011> plane relative to the substrate surface.

19. The VCFET of any of clauses 1-18, wherein:

the source/drain is comprised of a first material comprised of the group consisting of silicon and silicon germanium; and the drain/source is comprised of a second material comprised of the group consisting of silicon and silicon germanium.

20. The VCFET of any of clauses 1-19, wherein:

the source/drain is adjacent to the first end surface of the first channel portion adjacent to the substrate surface; and the drain/source is adjacent to the fourth end surface of the second channel portion.

21. The VCFET of any of clauses 1-20 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A method of fabricating a vertical channel field-effect transistor (VCFET), comprising:
 providing a substrate comprising a substrate surface;
 forming a channel, comprising:
  forming a first channel portion comprising a first end surface and a second end surface opposite the first end surface,
   the second end surface having a first width in a first direction parallel to the substrate surface; and
  forming a second channel portion comprising a third end surface coupled to the second end surface and a fourth end surface opposite the third end surface,
   the fourth end surface having a second width in the first direction greater than the first width;
 forming a gate adjacent to the first channel portion;
 forming a source/drain coupled to the first end surface of the first channel portion; and
 forming a drain/source coupled to the fourth end surface of the second channel portion.

23. The method of clause 22, further comprising:
 forming a first spacer comprising at least one first air gap adjacent to the first end surface of the first channel portion and the gate; and
 forming a second spacer comprising at least one second air gap adjacent to the second end surface of the first channel portion and the gate.

24. The method of clause 23, wherein:
 forming the first spacer comprises forming each of the at least one first air gap having a first length extending in the first direction parallel to the substrate surface and a first height extending in a second direction orthogonal to the substrate surface, the first length is greater than the first height; and
 forming the second spacer comprises forming each of the at least one second air gap having a second length extending in the first direction, and a second height extending in the second direction, the second length greater than the second height.

25. The method of any of clauses 22-24, further comprising:
 coupling a first contact to the source/drain, the first contact extending in a second direction orthogonal to the substrate surface and along a first longitudinal axis; and
 coupling a second contact coupled to the drain/source, the second contact extending in the second direction along a second longitudinal axis parallel to the first longitudinal axis.

26. The method of clause 23 or 24, wherein forming the first spacer comprises:
 forming a plurality of first dielectric layers;
 forming a plurality of second dielectric layers, each second dielectric layer of the plurality of second dielectric layers disposed between two adjacent first dielectric layers of the plurality of first dielectric layers; and
 removing the plurality of second dielectric layers forming the at least one first air gap each disposed between two adjacent first dielectric layers of the plurality of first dielectric layers.

27. The method of clause 26, further comprising forming a hard mask on the second end surface of the first channel portion before removing the plurality of second dielectric layers.

28. The method of clause 26 or 27, further comprising:
 forming a dielectric layer on the first spacer; and
 wherein forming the second spacer comprises:
  forming a plurality of third dielectric layers; and
  forming a plurality of fourth dielectric layers, each fourth dielectric layer of the plurality of fourth dielectric layers disposed between two adjacent third dielectric layers of the plurality of third dielectric layers.

29. The method of clause 28, further comprising:
 forming an opening in the plurality of third dielectric layers and the plurality of fourth dielectric layers adjacent to the second end surface of the first channel portion;
 forming the second channel portion in the opening coupled to the second end surface of the first channel portion; and
 removing the plurality of fourth dielectric layers forming the at least one second air gap each disposed between two adjacent third dielectric layers of the plurality of third dielectric layers.

30. The method of clause 29, further comprising:
 recessing the dielectric layer adjacent to the first channel portion; and
 depositing a metal gate adjacent to the first channel portion to form the gate.

31. The method of any of clauses 22-30, wherein:
 forming the source/drain comprises epitaxially growing the source/drain in contact with the first end surface of the first channel portion; and
 forming the drain/source comprises epitaxially growing the drain/source on the fourth end surface of the second channel portion.

32. An integrated circuit (IC), comprising:
 a substrate comprising a substrate surface;
 a plurality of field-effect transistors (FETs) on the substrate surface, the plurality of FETs, comprising:
  a P-semiconductor type (P-type) FET, comprising:
   a P-type channel, comprising:
    a first P-type channel portion comprising a first end surface and a second end surface opposite the first end surface,
    the second end surface having a first width in a first direction parallel to the substrate surface; and
    a second P-type channel portion comprising a third end surface coupled to the second end surface and a fourth end surface opposite the third end surface,
    the fourth end surface having a second width in the first direction greater than the first width;
   a first gate adjacent to the first P-type channel portion;
   a P-type source/drain coupled to the first end surface of the first P-type channel portion; and
   a P-type drain/source coupled to the fourth end surface of the second P-type channel portion; and
  an N-semiconductor type (N-type) FET, comprising:
   a N-type channel, comprising:

a first N-type channel portion comprising a fifth end surface and a sixth end surface opposite the fifth end surface, the sixth end surface having a third width in the first direction parallel to the substrate surface; and a second N-type channel portion comprising a seventh end surface coupled to the sixth end surface and an eighth end surface opposite the seventh end surface, the eighth end surface having a fourth width in the first direction greater than the third width;

a second gate adjacent to the first N-type channel portion;

an N-type source/drain coupled to the fifth end surface of the first N-type channel portion; and an N-type drain/source coupled to the eighth end surface of the second N-type channel portion.

33. The IC of clause 32, wherein:

the P-type channel is configured to transport charge in a second direction orthogonal to the substrate surface; and the N-type channel is configured to transport charge in the second direction orthogonal to the substrate surface.

What is claimed is:

1. A vertical channel field-effect transistor (VCFET), comprising:

a substrate comprising a substrate surface;

a channel, comprising:

a first channel portion comprising a first end surface, the first end surface having a first width in a first direction parallel to the substrate surface; and a second channel portion comprising a fourth end surface, the fourth end surface having a second width in the first direction greater than the first width;

a gate adjacent to the first channel portion;

a source/drain coupled to the first end surface of the first channel portion;

a drain/source coupled to the fourth end surface of the second channel portion;

a first spacer adjacent to the gate and the source/drain, the first spacer comprising:

a plurality of first dielectric layers each extending in the first direction and parallel to each other in the first direction; and one or more first air gaps each between two first dielectric layers that are adjacent to each other for each of the plurality of first dielectric layers;

wherein each of the one or more first air gaps has a first length extending in the first direction and a first height extending in a second direction orthogonal to the substrate surface, and the first length is greater than the first height.

2. The VCFET of claim 1, wherein the channel is configured to transport charge in a second direction orthogonal to the substrate surface.

3. The VCFET of claim 1, wherein a ratio of the second width to the first width is at least 1.1.

4. The VCFET of claim 1, wherein:

the first width is between one (1) nanometer (nm) and ten (10) nm; and the second width is between one (1) nm and twenty (20) nm.

5. The VCFET of claim 1, wherein:

the first channel portion has a first height in a second direction orthogonal to the substrate surface;

the first width is less than the first height; and the second channel portion has a second height in the second direction.

6. The VCFET of claim 1, wherein:

the first spacer is adjacent to the first end surface of the first channel portion and the gate.

7. The VCFET of claim 1, further comprising:

a spacer sidewall extending in a second direction orthogonal to the substrate surface and along a first longitudinal axis orthogonal to the substrate surface; and the spacer sidewall adjacent to the first spacer and the gate.

8. The VCFET of claim 1, wherein:

the one or more first air gaps comprise a plurality of first air gaps.

9. The VCFET of claim 1, wherein:

the plurality of first dielectric layers comprises Silicon Nitride (SiN.

10. The VCFET of claim 1, wherein the first channel portion comprises a first sidewall; and wherein the gate surrounds the first sidewall of the first channel portion.

11. The VCFET of claim 1, wherein an effective length of the gate, $L_{eff}$, is defined by a first height of the gate in a second direction orthogonal to the substrate surface.

12. The VCFET of claim 1, further comprising a P semiconductor type (P-type) well adjacent to the substrate; wherein:

the source/drain comprises an N-type source/drain;

the drain/source comprises an N-type drain/source; and the N-type source/drain is disposed in the P-type well.

13. The VCFET of claim 12, wherein a crystal structure for a channel sidewall of the channel is oriented in a <001> plane relative to the substrate surface.

14. The VCFET of claim 1, further comprising an N semiconductor type (N-type) well adjacent to the substrate; wherein:

the source/drain comprises a P-type source/drain;

the drain/source comprises a P-type drain/source; and the P-type source/drain is disposed in the N-type well.

15. The VCFET of claim 14, wherein a crystal structure for a channel sidewall of the channel is oriented in a <011> plane relative to the substrate surface.

16. The VCFET of claim 1, wherein:

the source/drain is comprised of a first material comprised of the group consisting of silicon and silicon germanium; and the drain/source is comprised of a second material comprised of the group consisting of silicon and silicon germanium.

17. The VCFET of claim 1, wherein:

the source/drain is adjacent to the first end surface of the first channel portion adjacent to the substrate surface; and the drain/source is adjacent to the fourth end surface of the second channel portion.

18. The VCFET of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. The VCFET of claim 1, wherein the first spacer is further adjacent to the gate and the first end surface of the first channel portion.

20. The VCFET of claim 1, wherein:
the plurality of first dielectric layers comprises:
a first, first dielectric layer;
a second, first dielectric layer; and
a third, first dielectric layer; and
the one or more first air gaps comprise:
a first, first air gap between the first, first dielectric layer and the second, first dielectric layer; and
a second, first air gap between the second, first dielectric layer and the third, first dielectric layer.

21. The VCFET of claim 1, further comprising:
a second spacer adjacent to the gate and the drain/source, the second spacer comprising:
a plurality of second dielectric layers each extending in the first direction and parallel to each other in the first direction; and
one or more second air gaps each between two second dielectric layers that are adjacent to each other for each of the plurality of second dielectric layers.

22. The VCFET of claim 21, further comprising:
a spacer sidewall extending in a second direction orthogonal to the substrate surface and along a first longitudinal axis orthogonal to the substrate surface; and
the spacer sidewall adjacent to the second spacer and the gate.

23. An integrated circuit (IC), comprising:
a substrate comprising a substrate surface;
a plurality of field-effect transistors (FETs) on the substrate surface, the plurality of FETs, comprising:
a P-semiconductor type (P-type) FET, comprising:
a P-type channel, comprising:
a first P-type channel portion comprising a first end surface,
the first end surface having a first width in a first direction parallel to the substrate surface; and
a second P-type channel portion comprising a fourth end surface,
the fourth end surface having a second width in the first direction greater than the first width;
a first gate adjacent to the first P-type channel portion;
a P-type source/drain coupled to the first end surface of the first P-type channel portion;
a P-type drain/source coupled to the fourth end surface of the second P-type channel portion;
a first spacer adjacent to the first gate and the P-type source/drain, the first spacer comprising:
a plurality of first dielectric layers each extending in the first direction and parallel to each other in the first direction; and
one or more first air gaps each between two first dielectric layers that are adjacent to each other for each of the plurality of first dielectric layers;
wherein each of the one or more first air gaps has a first length extending in the first direction and a first height extending in a second direction orthogonal to the substrate surface, and the first length is greater than the first height; and
an N-semiconductor type (N-type) FET, comprising:
a N-type channel, comprising:
a first N-type channel portion comprising a fifth end surface,
the fifth end surface having a third width in the first direction parallel to the substrate surface; and
a second N-type channel portion comprising an eighth end surface,
the eighth end surface having a fourth width in the first direction greater than the third width;
a second gate adjacent to the first N-type channel portion;
an N-type source/drain coupled to the fifth end surface of the first N-type channel portion;
an N-type drain/source coupled to the eighth end surface of the second N-type channel portion; and
a second spacer adjacent to the second gate and the N-type source/drain, the second spacer comprising:
a plurality of second dielectric layers each extending in the first direction and parallel to each other in the first direction; and
one or more second air gaps each between two second dielectric layers that are adjacent to each other for each of the plurality of second dielectric layers;
wherein each of the one or more second air gaps has a second length extending in the first direction and a second height extending in the second direction orthogonal to the substrate surface, and the second length is greater than the second height.

24. The IC of claim 23, wherein:
the P-type channel is configured to transport charge in a second direction orthogonal to the substrate surface; and
the N-type channel is configured to transport charge in the second direction orthogonal to the substrate surface.

25. The IC of claim 23, wherein:
the first spacer is further adjacent to the first gate and the first end surface of the first P-type channel portion; and
the second spacer is further adjacent to the second gate and the fifth end surface of the first N-type channel portion.

26. The IC of claim 23, wherein:
the plurality of first dielectric layers comprises:
a first, first dielectric layer;
a second, first dielectric layer; and
a third, first dielectric layer;
the one or more first air gaps comprise:
a first, first air gap between the first, first dielectric layer and the second, first dielectric layer; and
a second, first air gap between the second, first dielectric layer and the third, first dielectric layer;
the plurality of second dielectric layers comprises:
a first, second dielectric layer;
a second, second dielectric layer; and
a third, second dielectric layer; and
the one or more second air gaps comprise:
a first, second air gap between the first, second dielectric layer and the second, second dielectric layer; and
a second, second air gap between the second, second dielectric layer and the third, second dielectric layer.

* * * * *